(12) United States Patent
Jeong et al.

(10) Patent No.: US 12,495,706 B2
(45) Date of Patent: Dec. 9, 2025

(54) ELECTROLUMINESCENT DISPLAY DEVICE

(71) Applicant: LG Display Co., Ltd., Seoul (KR)

(72) Inventors: Dayeon Jeong, Sejong (KR);
Chulyoung Jang, Daegu (KR);
SangMo Byun, Gimpo-si (KR); Hyun Kim, Gimpo-si (KR); Yooji Hwang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 533 days.

(21) Appl. No.: 18/056,222

(22) Filed: Nov. 16, 2022

(65) Prior Publication Data

US 2023/0180538 A1 Jun. 8, 2023

(30) Foreign Application Priority Data

Dec. 3, 2021 (KR) ........................ 10-2021-0171910

(51) Int. Cl.
*H01L 51/00* (2006.01)
*H10D 30/67* (2025.01)
(Continued)

(52) U.S. Cl.
CPC ....... *H10K 59/874* (2023.02); *H10D 30/6755* (2025.01); *H10K 50/844* (2023.02); *H10K 59/123* (2023.02); *H10K 59/873* (2023.02); *H10K 71/00* (2023.02); *H10K 50/11* (2023.02); *H10K 59/12* (2023.02); *H10K 59/1201* (2023.02); *H10K 2102/3026* (2023.02)

(58) Field of Classification Search
CPC .......................... H10K 59/874; H10K 50/846
See application file for complete search history.

(56) References Cited

U.S. PATENT DOCUMENTS

2016/0087241 A1   3/2016  Kim
2018/0351131 A1*  12/2018 Hiramatsu ........... H10K 50/805
(Continued)

FOREIGN PATENT DOCUMENTS

CN       104576689 A  *  4/2015  ........... H10K 59/874
KR   10-2016-0073620 A  *  6/2016  ......... H10D 30/6755
(Continued)

OTHER PUBLICATIONS

Machine translation, Shin, Chinese Pat. Pub. No. CN-104576689-A, translation date: Jun. 5, 2025, Clarivate Analytics, all pages. (Year: 2025).*
(Continued)

*Primary Examiner* — Victoria K. Hall
(74) *Attorney, Agent, or Firm* — Seed Intellectual Property Law Group LLP

(57) ABSTRACT

An electroluminescent display device according to an example embodiment of the present disclosure may include a substrate including an active area having an emission area and a non-active area, a planarization layer disposed on the substrate, a light emitting element disposed on the planarization layer, a buffer layer disposed on the light emitting element and having a plurality of holes in a surface thereof and a hydrogen trap layer disposed on the buffer layer. As a result, by preventing hydrogen inflow into an oxide thin film transistor, characteristics and reliability of the thin film transistor can be improved.

21 Claims, 15 Drawing Sheets

(51) Int. Cl.
  *H10K 50/844* (2023.01)
  *H10K 59/123* (2023.01)
  *H10K 59/80* (2023.01)
  *H10K 71/00* (2023.01)
  *H10K 50/11* (2023.01)
  *H10K 59/12* (2023.01)
  *H10K 102/00* (2023.01)

(56) References Cited

U.S. PATENT DOCUMENTS

| | | | | |
|---|---|---|---|---|
| 2020/0075887 | A1* | 3/2020 | Kim | H10K 50/8426 |
| 2020/0152913 | A1* | 5/2020 | Noh | H10K 59/873 |
| 2020/0381650 | A1* | 12/2020 | Shin | H10K 59/131 |
| 2021/0202910 | A1* | 7/2021 | Lee | H10D 86/60 |

FOREIGN PATENT DOCUMENTS

| | | | | |
|---|---|---|---|---|
| KR | 10-2019-115213 A | * | 10/2019 | C09D 101/00 |
| KR | 20190115213 A | | 10/2019 | |
| KR | 20200054734 A | | 5/2020 | |
| KR | 20210084835 A | | 7/2021 | |

OTHER PUBLICATIONS

Machine translation, Gee, Korean Pat. Pub. No. KR20160073620A, translation date: Jun. 3, 2025, Espacenet, all pages. (Year: 2025).*
Request for the Submission of an Opinion, Korean Intellectual Property Office, Korean App. No. 10-2019-0171910, Jun. 23, 2025. (Year: 2025).*
Machine translation, Chang, Korean App. No. KR2019115213A, Espacenet, translation date: Jul. 28, 2025, all pages. (Year: 2025).*

* cited by examiner

ELECTROLUMINESCENT DISPLAY DEVICE

CROSS-REFERENCE TO RELATED APPLICATIONS

This application claims the benefit of and priority to Korean Patent Application No. 10-2021-0171910 filed on Dec. 3, 2021 in the Republic of Korea, the entire contents of which are hereby expressly incorporated by reference into the present application.

BACKGROUND

Technical Field

The present disclosure relates to an electroluminescent display device, and more particularly, to an electroluminescent display device using an oxide thin film transistor.

Description of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Representative display devices include a liquid crystal display device (LCD), an electro-wetting display device (EWD), an organic light emitting display device (OLED), and the like.

Among these various display devices, an electroluminescent display device including an organic light emitting display device is a self-light emitting display device, and can be manufactured to be light and thin since it does not require a separate light source, unlike a liquid crystal display device having a separate light source. In addition, the electroluminescent display device has advantages in terms of power consumption due to a low voltage driving, and is excellent in terms of a color implementation, a response speed, a viewing angle, and a contrast ratio (CR). Therefore, electroluminescent display devices are expected to be utilized in various fields.

The electroluminescent display device is constructed by disposing a light emitting layer using an organic material between two electrodes that are referred to as an anode and a cathode. Then, when holes from the anode are injected into the light emitting layer and electrons from the cathode are injected into the light emitting layer, the injected electrons and holes recombine with each other to form excitons in the light emitting layer and emit light.

BRIEF SUMMARY

An aspect of the present disclosure is to provide an electroluminescent display device that blocks hydrogen inflow into an oxide thin film transistor.

Technical benefits of the present disclosure are not limited to the above-mentioned technical benefits, and other technical benefits, which are not mentioned above, can be clearly understood by those skilled in the art from the following descriptions.

An electroluminescent display device according to an example embodiment of the present disclosure may include a substrate including an active area and a non-active area, the active area having an emission area, a planarization layer disposed on the substrate, a light emitting element disposed on the planarization layer, a buffer layer disposed on the light emitting element and having a plurality of holes in a surface thereof and a hydrogen trap layer disposed on the buffer layer.

An electroluminescent display device according to another example embodiment of the present disclosure may include a planarization layer disposed on a substrate, a light emitting element disposed on the planarization layer, a buffer layer disposed on the light emitting element and having a plurality of holes in a surface thereof and a hydrogen trap layer disposed on the buffer layer and having grooves on a surface thereof corresponding to the holes.

A method according to an embodiment includes: forming a planarization layer on a substrate; forming a light emitting element on the planarization layer; forming a buffer layer on the light emitting element; forming a plurality of holes in the buffer layer; and forming a hydrogen trap layer on the buffer layer, the hydrogen trap layer having a plurality of grooves on a surface thereof, each of the plurality of grooves overlapping a respective one of the plurality of holes.

Other detailed matters of the example embodiments are included in the detailed description and the drawings.

According to the present disclosure, hydrogen inflow into an oxide thin film transistor is blocked by forming a hydrogen trap layer on a light emitting element, so that characteristics and reliability of the thin film transistor can be improved.

The effects according to the present disclosure are not limited to the contents exemplified above, and more various effects are included in the present specification.

DETAILED DESCRIPTION

Figure 1:
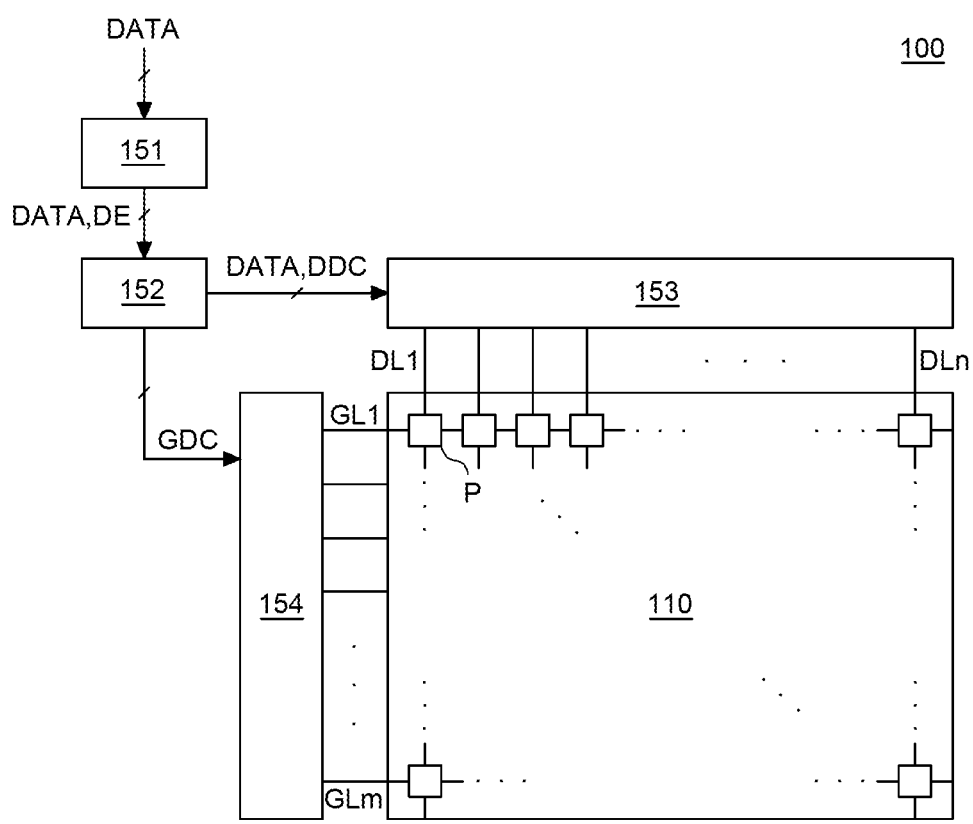
FIG. 1 is a block diagram of an electroluminescent display device according to a first example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various example embodiments of the present disclosure will be described in detail with reference to the accompanying drawings.

FIG. 1 is a block diagram of an electroluminescent display device according to a first example embodiment of the present disclosure.

Referring to FIG. 1, an electroluminescent display device 100 according to the first example embodiment of the present disclosure may include an image processor 151, a timing controller 152, a data driver 153, a gate driver 154, and a display panel 110.

The image processor 151 may output a data signal DATA and a data enable signal DE through a data signal DATA supplied from the outside, such as from circuitry external to the electroluminescent display device 100.

The image processor 151 may output one or more of a vertical synchronization signal, a horizontal synchronization signal, and a clock signal in addition to the data enable signal DE.

The timing controller 152 receives the data signal DATA together with the data enable signal DE or driving signals including the vertical synchronization signal, the horizontal synchronization signal, and the clock signal from the image processor 151. The timing controller 152 may output a gate timing control signal GDC for controlling an operation timing of the gate driver 154 and a data timing control signal DDC for controlling an operation timing of the data driver 153 based on the driving signals.

The data driver 153 samples and latches the data signal DATA supplied from the timing controller 152 in response to the data timing control signal DDC supplied from the timing controller 152, and converts the data signal DATA into a gamma reference voltage to thereby output it. The data driver 153 may output the data signal DATA through data lines DLI to DLn.

The gate driver 154 may output a gate signal while shifting a level of the gate voltage in response to the gate timing control signal GDC supplied from the timing controller 152. The gate driver 154 may output the gate signal through gate lines GL1 to GLm.

The display panel 110 may display an image while sub-pixels P emit light in response to the data signal DATA and the gate signal supplied from the data driver 153 and the gate driver 154. A detailed structure of the sub-pixel P will be described in detail in FIG. 2 and FIG. 5.

Figure 2:
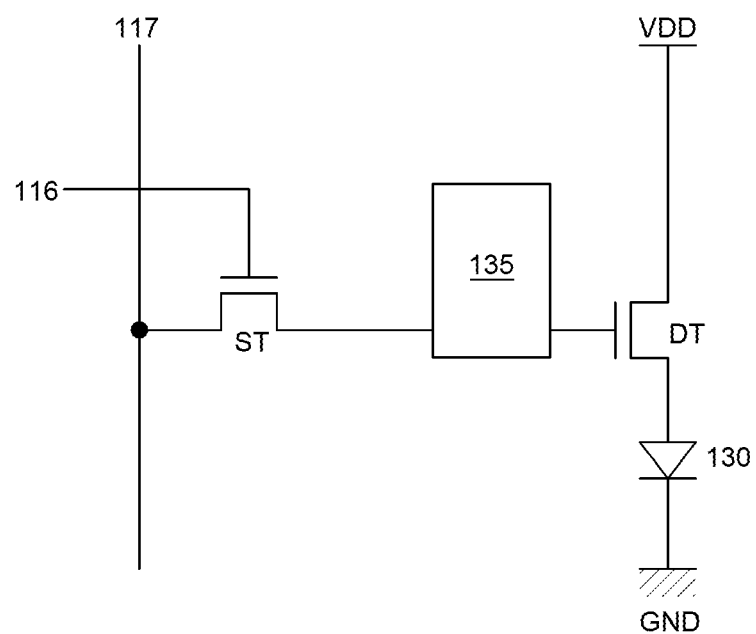
FIG. 2 is a circuit diagram of a sub-pixel of the electroluminescence display device according to the first example embodiment of the present disclosure.

FIG. 2 is a circuit diagram of a sub-pixel included in the electroluminescent display device according to the first example embodiment of the present disclosure.

Referring to FIG. 2, the sub-pixel of the electroluminescent display device 100 according to the first example embodiment of the present disclosure may include a switching transistor ST, a driving transistor DT, a compensation circuit 135, and a light emitting element 130.

The light emitting element 130 may operate to emit light according to a driving current that is generated by the driving transistor DT.

The switching transistor ST may perform a switching operation such that a data signal supplied through a data line 117 in response to the gate signal supplied through a gate line 116 is stored as a data voltage in a capacitor.

The driving transistor DT may operate such that a constant driving current flows between a high potential power line VDD and a low potential power line GND in response to the data voltage stored in the capacitor.

The compensation circuit 135 is a circuit for compensating for a threshold voltage or the like of the driving transistor DT, and the compensation circuit 135 may include one or more thin film transistors and capacitors. A configuration of the compensation circuit 135 may vary according to a compensation method.

It is illustrated that the sub-pixel shown in FIG. 2 is configured to have a two-transistor-one-capacitor (2T1C) structure including the switching transistor ST, the driving transistor DT, the capacitor, and the light emitting element 130. However, the sub-pixel may have various structures, such as 3T1C, 4T2C, 5T2C, 6T1C, 6T2C, 7T1C and 7T2C structures when the compensation circuit 135 is added thereto.

Figure 3:
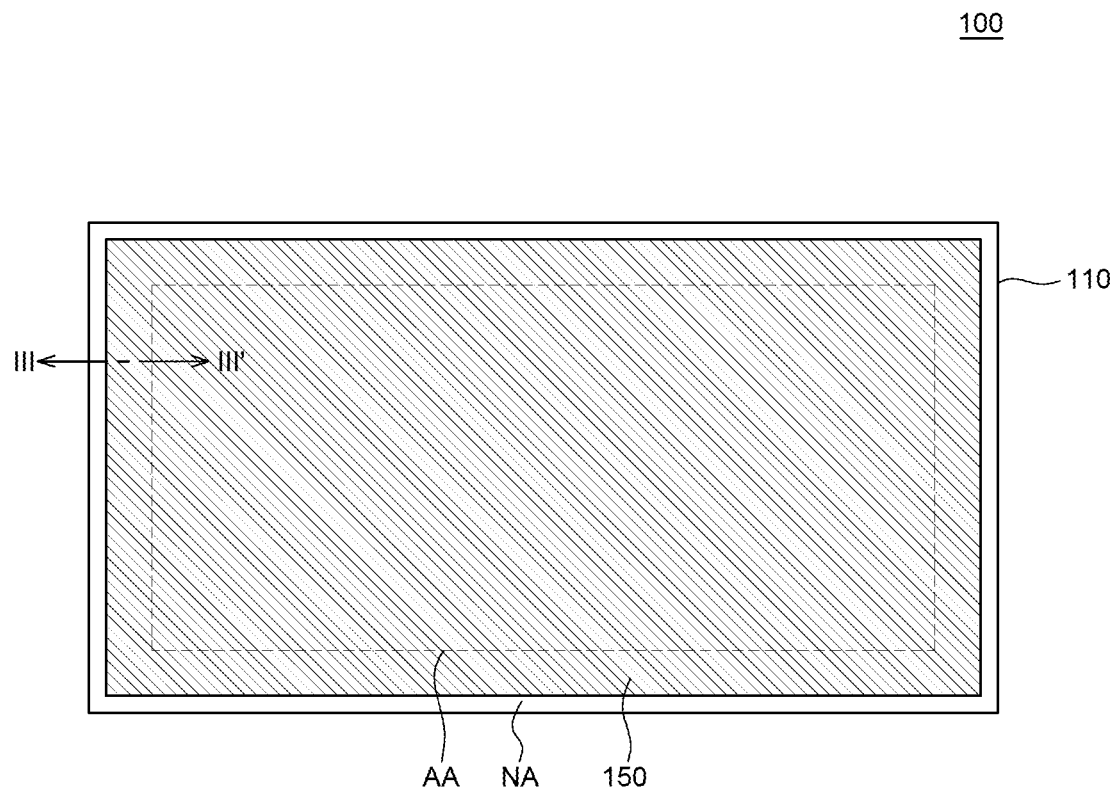
FIG. 3 is a plan view of the electroluminescent display device according to the first example embodiment of the present disclosure.

FIG. 3 is a plan view of the electroluminescent display device according to the first example embodiment of the present disclosure.

Figure 4:
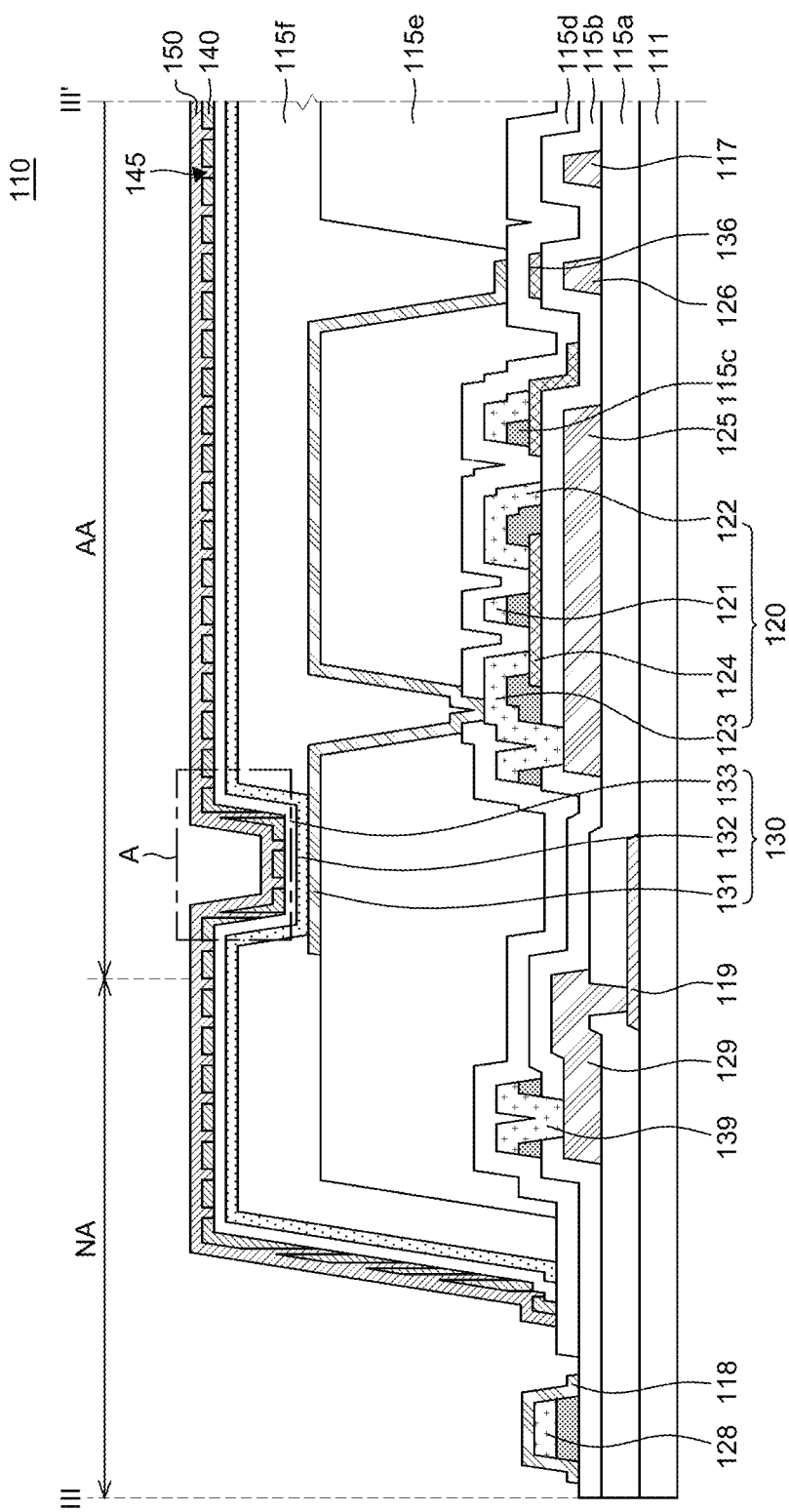
FIG. 4 is a cross-sectional view taken along line III-III' of FIG. 3.

FIG. 4 is a cross-sectional view taken along line III-III' of FIG. 3.

Figure 5A:
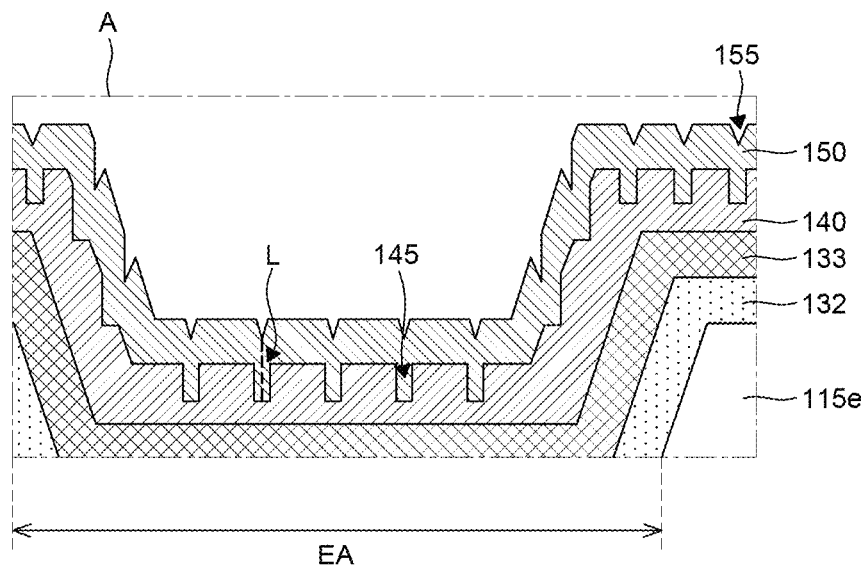
FIGS. 5A and 5B are enlarged views of part A of FIG. 4.
Figure 5B:
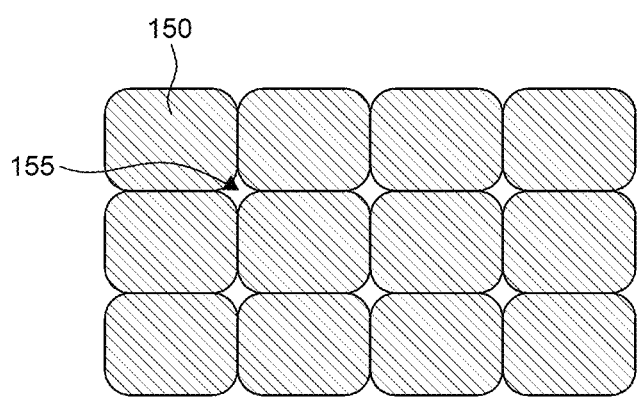

FIGS. 5A and 5B are enlarged views of part A of FIG. 4.

FIG. 4 illustrates a case in which a touch unit or touch circuitry is included in the display panel 110, but the present disclosure is not limited thereto.

FIG. 5A is an enlarged cross-sectional view of part A of FIG. 4, and FIG. 5B is a plan view showing an upper surface of FIG. 5A.

Referring to FIG. 3, the electroluminescent display device 100 according to the first example embodiment of the present disclosure may include the display panel 110, flexible films, and a printed circuit board.

The display panel 110 is a panel for displaying an image to a user.

In the display panel 110, display elements for displaying an image, a driving element for driving the display elements, and lines for transmitting various signals to the display elements and the driving element may be disposed. The display element may be embodied differently according to a type of the display panel 110. For example, when the display panel 110 is an organic light emitting display panel, the display element is an organic light emitting element including an anode, an organic light emitting layer, and a cathode.

Hereinafter, it is described assuming that the display panel 110 is an organic light emitting display panel, but the display panel 110 is not limited to the organic light emitting display panel.

The display panel 110 may include an active area AA and a non-active area NA.

The active area AA is an area in which an image is displayed on the display panel 110.

A plurality of sub-pixels that belong to a plurality of pixels and a circuit for driving the plurality of sub-pixels may be disposed in the active area AA. The plurality of sub-pixels belong to the active area AA, a respective display element may be disposed in each of the plurality of sub-pixels, and a group (e.g., four) of the plurality of sub-pixels may constitute one of the plurality of pixels. For example, a respective organic light emitting element including an anode, an organic light emitting layer, and a cathode may be disposed in each of the plurality of sub-pixels, but the present disclosure is not limited thereto. In addition, the circuit for driving the plurality of sub-pixels may include a driving element, lines and the like. For example, the circuit may include a thin film transistor, a storage capacitor, a gate line, a data line, and the like, but the present disclosure is not limited thereto.

The non-active area NA is an area in which an image is not displayed.

FIG. 3 illustrates that the non-active area NA is adjacent to, and surrounds on four sides, the active area AA having a quadrangular shape, but shapes and arrangements of the active area AA and the non-active area NA are not limited to the example illustrated in FIG. 3.

The active area AA and the non-active area NA may have a shape suitable for designing an electronic apparatus on which the electroluminescent display device 100 is mounted. For example, another example shape of the active area AA may be a pentagonal shape, a hexagonal shape, a circular shape, or an oval shape.

Various lines and circuits for driving the organic light emitting element of the active area AA may be disposed in the non-active area NA. For example, in the non-active area NA, driver integrated circuits (ICs) such as a gate driver IC and a data driver IC or link lines for transmitting signals to the plurality of sub-pixels and circuits of the active area AA may be disposed, but the present disclosure is not limited thereto.

Meanwhile, left and right sides of FIG. 3 may be a gate pad portion on which the gate driver IC is disposed, and a lower side of FIG. 3 may be a data pad portion to which the flexible films are connected, but the present disclosure is not limited thereto.

The electroluminescent display device may include various additional elements for generating various signals or driving the pixels in the active area AA. The additional elements for driving the pixels may include an inverter circuit, a multiplexer, an electro-static discharge (ESD) circuit, and the like. The electroluminescent display device may include additional elements associated with functions other than driving the pixels. For example, the electroluminescent display device may include additional elements that provide a touch sensing function, a user authentication function (e.g., fingerprint recognition), a multi-level pressure sensing function, a tactile feedback function, and the like. Such additional elements may be positioned in the non-active area NA and/or in an external circuit connected to a connection interface.

Although not illustrated, the flexible films are films for supplying signals to the plurality of sub-pixels and circuits of the active area AA, and may be electrically connected to the display panel 110. The flexible films may be disposed at one end of the non-active area NA of the display panel 110 and supply a power voltage, a data voltage and the like to the plurality of sub-pixels and circuits of the active area AA. For example, a driver IC such as a data driver IC may be disposed on the flexible films.

The printed circuit board may be disposed at one end of the flexible films and connected to the flexible films. The printed circuit board is a component that supplies signals to the driver IC. The printed circuit board may supply various signals such as a driving signal and a data signal to the driver IC.

Meanwhile, excellent characteristics of the display panel are secured by using an oxide thin film transistor having characteristics of high mobility and low off current.

However, when SiOx or SiNx, which is mainly used as a protective layer of the oxide thin film transistor, is deposited, hydrogen in the protective layer may flow into the oxide thin film transistor. The hydrogen ionically combines with oxygen in the oxide thin film transistor to act as a shallow donor or goes into an oxygen vacancy which is an electron trap center, which increases difficulty of controlling on-voltage (Von) and off-voltage (Voff) of the oxide thin film transistor.

Accordingly, embodiments of the present disclosure prevent hydrogen inflow into the thin film transistor by using hydrogen trapping properties of aluminum.

To this end, the first example embodiment of the present disclosure includes a hydrogen trap layer 150 formed on the light emitting element to prevent hydrogen inflow into the oxide thin film transistor. Accordingly, it is possible to improve characteristics and reliability of the thin film transistor.

Referring to FIG. 4 and FIGS. 5A and 5B, a substrate 111 may include an active area AA and a non-active area NA adjacent to and outside the active area AA.

A thin film transistor 120, the light emitting element 130, and an encapsulation layer (not shown) may be formed in the active area AA of the substrate 111.

The substrate 111 serves to support and protect components of the electroluminescent display device disposed thereon.

Recently, the flexible substrate 111 may be used with a flexible material having flexible characteristics such as plastic.

The flexible substrate 111 may be in a form of a film including one of a polyester-based polymer, a silicone-based polymer, an acrylic polymer, a polyolefin-based polymer, a copolymer thereof, or the like.

A touch sensor 119 may be disposed on the substrate 111.

A buffer layer 115a may be disposed on the substrate 111 on which the touch sensor 119 is disposed.

The buffer layer 115a may be formed in a structure in which a single insulating layer or a plurality of insulating layers are stacked in order to block foreign materials including moisture, oxygen and the like, flowing from the substrate 111. That is, the buffer layer 115a may be formed of a single layer or multilayer structure of an inorganic insulating material such as silicon oxide (SiOx), silicon nitride (SiNx), or aluminum oxide (AlOx). The buffer layer 115a may be omitted in some embodiments according to a type of the thin film transistor 120.

The buffer layer 115a may include a contact hole exposing a portion of the touch sensor 119.

A light blocking layer 125 may be disposed on the buffer layer 115a.

The light blocking layer 125 may be formed of a metallic material having a light blocking function in order to block external light from being introduced into a semiconductor layer 124.

The light blocking layer 125 may be formed in a single layer or multilayer structure formed of any one of opaque metals such as aluminum (Al), chromium (Cr), tungsten (W), titanium (Ti), nickel (Ni), neodymium (Nd), molybdenum (Mo) and copper (Cu), or alloys thereof.

A first capacitor electrode 126 and the data line 117 may be disposed on the buffer layer 115a.

Also, a first touch electrode 129 that is electrically connected to the touch sensor 119 may be disposed on the buffer layer 115a.

A first insulating layer 115b may be disposed on the light blocking layer 125, the first capacitor electrode 126, the data line 117, and the first touch electrode 129.

In this case, the first insulating layer 115b may include contact holes exposing a portion of the light blocking layer 125 and the first touch electrode 129.

The first insulating layer 115b may be formed of a single layer of silicon oxide (SiOx) or silicon nitride (SiNx), or multiple layers thereof.

The thin film transistor 120 may be disposed on the first insulating layer 115b. In this case, the thin film transistor 120 may include a gate electrode 121, a source electrode 122, a drain electrode 123, and the semiconductor layer 124.

The semiconductor layer 124 may be formed of an oxide semiconductor. The oxide semiconductor has excellent mobility and uniformity properties. At this time, the oxide semiconductor may be formed of a quaternary metal oxide such as an indium tin gallium zinc oxide (InSnGaZnO)-based material, a ternary metal oxide such as an indium gallium zinc oxide (InGaZnO)-based material, an indium tin zinc oxide (InSnZnO)-based material, an indium aluminum zinc oxide (InAlZnO)-based material, a tin gallium zinc oxide (SnGaZnO)-based material, an aluminum gallium zinc oxide (AlGaZnO)-based material, and a tin aluminum zinc oxide (SnAlZnO)-based material, or a binary metal oxide such as an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium magnesium oxide (InMgO)-based material, an indium oxide (InO)-based material, a tin oxide (SnO)-based material, an indium gallium oxide (InGaO)-based material, and a zinc oxide (ZnO)-based material. Composition ratios of the respective elements are not limited.

The semiconductor layer 124 may include a source region including p-type or n-type impurities, a drain region, and a channel region between the source region and the drain region, and may further include a low concentration doped region between the source region and the drain region adjacent to the channel region.

The source region and the drain region are regions doped with a high concentration of impurities, and may be connected to the source electrode 122 and the drain electrode 123 of the thin film transistor 120, respectively.

As an impurity ion, a p-type impurity or n-type impurity may be used. The p-type impurity may be one of boron (B), aluminum (Al), gallium (Ga), and indium (In), and the n-type impurity may be one of phosphorus (P), arsenic (As), and antimony (Sb).

The channel region may be doped with the n-type impurity or p-type impurity according to an NMOS or PMOS transistor structure.

A second insulating layer 115c is a gate insulating layer composed of a single layer of silicon oxide (SiOx) or silicon nitride (SiNx) or multiple layers thereof, and may be disposed over the semiconductor layer 124 such that a current flowing through the semiconductor layer 124 does not flow into the electrode 121. Silicon oxide is less ductile than metal, but is more ductile than silicon nitride, so that it may be formed as a single layer or multiple layers according to characteristics thereof.

The gate electrode 121 serves as a switch to turn on or off the thin film transistor 120 based on an electric signal that is transmitted from the outside through the gate line, and may be composed of a single layer or multiple layers of a conductive metal such as copper (Cu), aluminum (Al), molybdenum (Mo), chromium (Cr), gold (Au), titanium (Ti), nickel (Ni), neodymium (Nd) and the like, or alloys thereof. However, the present disclosure is not limited thereto.

In this case, the source electrode 122 and the drain electrode 123 may be composed of a single layer or multiple layers of a conductive metal such as aluminum (Al), molybdenum (Mo), chromium (Cr), gold (Au), titanium (Ti), nickel (Ni), neodymium (Nd), and copper (Cu) or alloys thereof, but the present disclosure is not limited thereto.

One side of the drain electrode 123 may be electrically connected to the semiconductor layer 124, and the other side of the drain electrode 123 may be electrically connected to the light blocking layer 125.

A second capacitor electrode 136 that is formed of the semiconductor layer 124 may be disposed on the first insulating layer 115b over the first capacitor electrode 126.

The second capacitor electrode 136 and the first capacitor electrode 126 may form a first storage capacitor with the first insulating layer 115b interposed therebetween.

A second touch electrode 139 that is electrically connected to the first touch electrode 129 may be disposed on the first insulating layer 115b of the non-active area NA.

Also, a first pad electrode 128 may be disposed on the first insulating layer 115b of the non-active area NA.

A passivation layer 115d may be disposed on the thin film transistor 120 and the second touch electrode 139. The passivation layer 115d may be formed of an inorganic insulating layer such as silicon oxide (SiOx) or silicon nitride (SiNx).

The passivation layer 115d may serve to prevent unnecessary electrical connection between components disposed thereon and therebelow and to prevent contamination or damage from the outside, and may be omitted according to configurations and characteristics of the thin film transistor 120 and the light emitting element 130.

Structures of the thin film transistor 120 may be classified into an inverted staggered structure and a coplanar structure according to positions of components constituting the thin film transistor 120. For example, in a thin film transistor having an inverted staggered structure, a gate electrode may be positioned on opposite sides of a source electrode and a drain electrode with respect to a semiconductor layer. As shown in FIG. 4, in the thin film transistor 120 having a coplanar structure, the gate electrode 121 may be positioned on the same side as the source electrode 122 and the drain electrode 123 with respect to the semiconductor layer 124.

Although the thin film transistor 120 having a coplanar structure is illustrated in FIG. 4, the electroluminescent display device according to the first example embodiment of the present disclosure may include a thin film transistor having an inverted staggered structure.

For convenience of explanation, only a driving thin film transistor 120 is illustrated among various thin film transistors that may be included in the electroluminescent display device, but other switching thin film transistors and compensation circuits may also be included in the electroluminescent display device.

The switching thin film transistor may transmit a signal from the data line 117 to the gate electrode 121 of the driving thin film transistor 120 when a signal is applied from the gate line. The driving thin film transistor 120 may transmit a current that is transmitted through a power line according to the signal received from the switching thin film transistor to an anode 131, and may control light emission by the current that is transmitted to the anode 131.

A planarization layer 115e may be disposed on the thin film transistor 120 to protect the thin film transistor 120 and alleviate a step that is caused by the thin film transistor 120, and to reduce parasitic capacitance generated between the thin film transistor 120, the gate line and the data line 117, and the light emitting element 130.

The planarization layer 115e may be formed of one or more materials among acrylic resin, epoxy resin, phenolic resin, polyamides resin, polyimides resin, unsaturated polyesters resin, polyphenylene resin, polyphenylene sulfides resin, and benzocyclobutene, but the present disclosure is not limited thereto.

A planarization layer or a buffer layer may be further disposed on the planarization layer 115e.

The buffer layer may be formed of multiple layers of silicon oxide (SiOx) and protect components disposed on the planarization layer 115e. The buffer layer may be omitted according to configurations and characteristics of the thin film transistor 120 and the light emitting element 130.

When the planarization layer is additionally disposed on the planarization layer 115e, the anode 131 may be electrically connected to the thin film transistor 120 through an intermediate electrode.

Meanwhile, the planarization layer 115e above the second capacitor electrode 136 may be removed, so that an anode hole may be formed, but the present disclosure is not limited thereto.

The insulating layer under the passivation layer 115d may be disposed to extend to an end of the substrate 111 in the non-active area NA, and the passivation layer 115d may be disposed to extend to a portion of the non-active area NA, but the present disclosure is not limited thereto. In addition, the planarization layer 115e may be disposed to extend to a portion of the non-active area NA and may expose a portion of the passivation layer 115d, but the present disclosure is not limited thereto.

A side surface of the planarization layer 115e extending to a portion of the non-active area NA may be inclined, but the present disclosure is not limited thereto.

The light emitting element 130 including the anode 131, a light emitting unit or structure 132, and a cathode 133 may be disposed on the planarization layer 115e.

The anode 131 may be disposed on the planarization layer 115e.

The anode 131 is an electrode serving to supply holes to the light emitting unit 132, and may be connected to the thin film transistor 120 through a contact hole in the planarization layer 115e.

The anode 131 may be formed of indium tin oxide (ITO), indium zinc oxide (IZO), or the like, which is a transparent conductive material, but the present disclosure is not limited thereto. For example, the first example embodiment of the present disclosure may be a bottom emission type that emits light to a lower portion where the anode 131 is disposed, but the present disclosure is not limited thereto.

One side of the anode 131 may extend into the anode hole and form a second capacitor with the passivation layer 115d and the second capacitor electrode 136 that are therebelow, interposed therebetween, but the present disclosure is not limited thereto.

A second pad electrode 118 may be disposed on the first pad electrode 128 in the non-active area NA and be electrically connected to the first pad electrode 128.

A bank 115f may be disposed on the anode 131 and the planarization layer 115e.

The bank 115f that is disposed on the anode 131 and the planarization layer 115e may have openings in which respective sub-pixels are positioned, the openings belonging to an area in which light emission occurs, that is, an emission area EA.

After a photoresist is formed on the anode 131, the bank 115f may be formed through a photolithography process. The photoresist refers to a photosensitive resin of which solubility in a developer is changed by an action of light, and a specific pattern can be obtained by exposing and developing the photoresist. The photoresist can be classified into a positive type photoresist and a negative type photoresist. In this case, the positive photoresist refers to a photoresist of which solubility in a developer for an exposed portion is increased by exposure, and when the positive photoresist is developed, a pattern in which the exposed portion is removed is obtained. The negative photoresist refers to a photoresist of which solubility in a developer for an exposed portion is lowered by exposure, and when the negative photoresist is developed, a pattern in which an unexposed portion is removed is obtained.

A fine metal mask (FMM), which is a deposition mask, may be used to form the light emitting unit 132 of the light emitting element 130.

In addition, in order to prevent damage that may be caused by contact with the deposition mask disposed on the bank 115f and to maintain a constant distance between the bank 115f and the deposition mask, a spacer formed of one of benzocyclobutene, photoacrylic, and polyimide, which is a transparent organic material, may be disposed on the bank 115f.

The bank 115f may include an opening exposing a portion of the anode 131 by removing a portion of the bank 115f in the emission area.

The bank 115f may be disposed to extend to a portion of the non-active area NA, and may be inclined along an inclined side surface of the planarization layer 115e, but the present disclosure is not limited thereto.

Meanwhile, a portion of the bank 115f adjacent to the inclined side surface of the planarization layer 115e may be removed to thereby expose the passivation layer 115d.

The light emitting unit 132 may be disposed between the anode 131 and the cathode 133.

The light emitting unit 132 which serves to emit light, may include at least one layer of a hole injection layer (HIL), a hole transport layer (HTL), a light emitting layer, an electron transport layer (ETL), and an electron injection layer (EIL), and some of the components may be omitted according to a structure or characteristics of the electroluminescent display device. Here, as the light emitting layer, an electroluminescent layer and an inorganic light emitting layer may also be applied.

The hole injection layer is disposed on the anode 131 and serves to facilitate hole injection.

The hole transport layer is disposed on the hole injection layer and serves to smoothly transfer holes to the light emitting layer.

The light emitting layer is disposed on the hole transport layer, and includes a material capable of emitting light of a specific color to thereby emit light of a specific color. In addition, a light emitting material may be formed using a phosphorescent material or a fluorescent material.

The electron transport layer is disposed on the light emitting layer and serves to transport electrons from the cathode 133 toward the light emitting layer. The electron transport layer may be formed of an organic material, and its composition may vary depending on the characteristics of the light emitting layer or the overall device structure.

The electron injection layer may be further disposed on the electron transport layer. The electron injection layer is an organic layer that facilitates injection of electrons from the cathode 133, and may be omitted according to the structure and characteristics of the electroluminescent display device.

Meanwhile, by further disposing an electron blocking layer or a hole blocking layer for blocking a flow of holes or electrons at a position adjacent to the light emitting layer, it is possible to prevent a phenomenon in which the electrons move from the light emitting layer when injected into the light emitting layer and pass through the hole transport layer adjacent thereto or a phenomenon in which the holes move from the light emitting layer when injected into the light emitting layer and pass through the electron transport layer adjacent thereto, so that luminous efficiency can be improved.

The light emitting unit 132 may be disposed to extend to a portion of the non-active area NA and may be inclined along the inclined side surface of the bank 115f, but the present disclosure is not limited thereto.

The light emitting unit 132 may be inclined along the inclined side surface of the bank 115f, but the present disclosure is not limited thereto.

The cathode 133 is disposed on the light emitting unit 132 and serves to supply electrons to the light emitting unit 132. Since the cathode 133 supplies electrons, it may be formed of a metallic material such as magnesium, a silver-magnesium alloy, or the like, which is a conductive material having a low work function, but the present disclosure is not limited thereto.

The cathode 133 may be disposed to extend to a portion of the non-active area NA to cover the light emitting unit 132, but the present disclosure is not limited thereto.

The cathode 133 may be inclined along an inclined side surface of the light emitting unit 132, but the present disclosure is not limited thereto.

A buffer layer 140 may be disposed on the cathode 133.

A plurality of holes 145 may be formed in a surface of the buffer layer 140.

The plurality of holes 145 formed in the surface of the buffer layer 140 may serve as seeds in which defects are generated and grown in the hydrogen trap layer 150 deposited on the buffer layer 140.

Since the light emitting unit 132 is easily damaged by external heat or chemical substances, the plurality of holes 145 may be formed in the surface of the buffer layer 140 using a laser.

When the plurality of holes 145 are formed in the surface of the buffer layer 140 through laser etching, they may have a circular shape when viewed from above, but the present disclosure is not limited thereto.

In order not to damage the cathode 133 and the light emitting unit 132, the buffer layer 140 may be formed to have a thickness of at least 1 μm.

The buffer layer 140 may be formed of an insulating material that does not allow hydrogen to pass therethrough and has excellent adhesion with aluminum of the hydrogen trap layer 150 and the cathode 133, and may be formed of, for example, aluminum oxide. Accordingly, the buffer layer 140 may block hydrogen trapped in the hydrogen trap layer 150 disposed thereover from flowing into the oxide thin film transistor 120 disposed therebelow.

The buffer layer 140 may be disposed to extend to a portion of the non-active area NA to cover the cathode 133, but the present disclosure is not limited thereto. The buffer layer 140 may be inclined along an inclined side surface of the cathode 133, but the present disclosure is not limited thereto. It should be understood that "cover" includes the meanings of fully cover and partially cover.

The hydrogen trap layer 150 may be disposed on the buffer layer 140 in which the plurality of holes 145 are formed.

The hydrogen trap layer 150 may be formed of an aluminum layer having dislocations and point defects to enhance hydrogen trapping properties between the cathode 133 and the encapsulation layer.

Hydrogen atoms that are adsorbed by passing between aluminum atoms may diffuse to and be trapped in trap sites such as dislocations, grain boundaries, and oxygen vacancies, which are most stable places in terms of energy.

Figure 6:
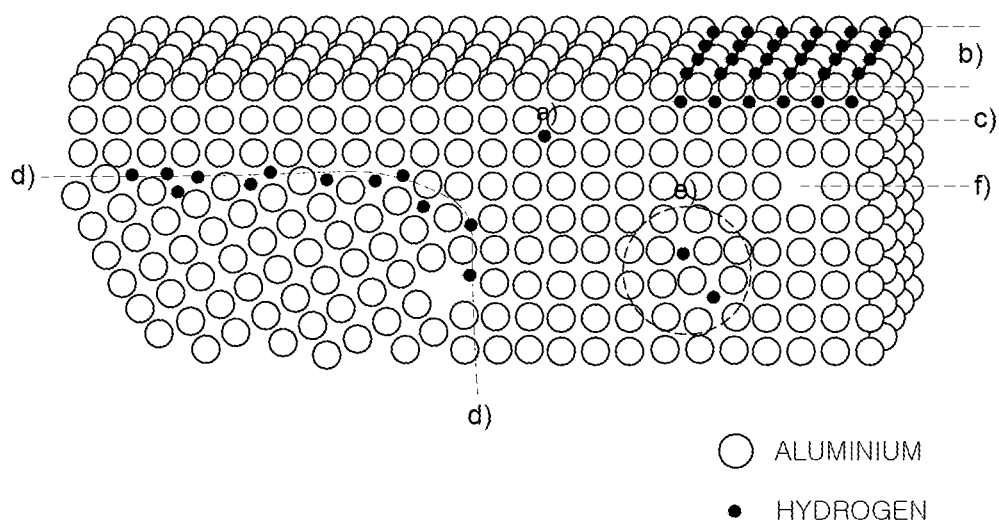
FIG. 6 is a view illustrating hydrogen trapping characteristics of aluminum.

FIG. 6 is a view illustrating hydrogen trapping characteristics of aluminum.

Referring to FIG. 6, a) indicates interstitial sites, b) indicates surfaces, and c) indicates subsurfaces. In addition, d) indicates grain boundaries, e) indicates dislocations, and f) indicates oxygen vacancies.

Oxygen atoms with a size of 1.06 Å, passing between aluminum atoms with a size of about 2.86 Å, may diffuse to and be trapped in trap sites of a) to e), which are the most stable places in terms of energy.

However, in general, aluminum has characteristics in which a hydrogen trap site is not formed well during deposition and aluminum is deposited with high quality.

Accordingly, the first example embodiment of the present disclosure is characterized in that the hydrogen trap layer 150 is formed on the buffer layer 140 in which the plurality of holes 145 are formed to generate and grow defects, thereby increasing hydrogen trap sites such as dislocations and point defects in the hydrogen trap layer 150. Accordingly, by preventing hydrogen inflow into the oxide thin film transistor 120, characteristics and reliability of the thin film transistor 120 can be improved.

That is, in a process of forming a thin film on a substrate, particles reach a surface thereof and then, move along the surface of the substrate by energy remaining in atoms, so that surface diffusion may be performed. Thereafter, a first atomic layer may be formed through chemical bonding between atoms by interaction with the atoms on the surface. In this manner, all the atoms on the surface combine with deposition atoms to thereby form the first atomic layer. Thereafter, the steps described above may be repeated to thereby form a second and subsequent atomic layers.

Meanwhile, when defect generating sites such as holes 145 are formed in the surface of the buffer layer 140, in a case in which the deposition atoms are formed while forming an atomic layer inside the holes 145 according to the process of forming a thin film, if deposition continues, the atomic layers formed on respective surfaces of the buffer layer 140, including insides of the holes 145, meet each other, and these atoms are out of existing regular atomic arrangement and combine with each other, whereby the hydrogen trap layer 150 is deposited such that these atoms are twisted, that is, defects are generated and grown in an upper direction (L) (see FIG. 5A).

As defect generating sites such as the holes 145 are formed in the surface of the buffer layer 140, the surface of the buffer layer 140, i.e., an upper surface thereof, may have an uneven shape. As shown in FIG. 5A, a lower surface of the hydrogen trap layer 150 is formed along the upper surface of the buffer layer 140 having an uneven shape, and an upper surface of the hydrogen trap layer 150 may have a shape including a plurality of recesses. The plurality of recesses may be formed at positions corresponding to the holes 145. As shown in FIG. 5B, as the plurality of recesses, i.e., grooves 155, are formed in the upper surface of the hydrogen trap layer 150, hydrogen trap sites such as dislocations and point defects increase.

The hydrogen trap layer 150 may be disposed to extend to a portion of the non-active area NA to cover the buffer layer 140, but the present disclosure is not limited thereto. It should be understood that "cover" includes the meaning of fully cover or partially cover.

The hydrogen trap layer 150 may be inclined along the inclined side surface of the buffer layer 140, but the present disclosure is not limited thereto.

Meanwhile, although not shown, on an upper portion of the hydrogen trap layer 150, an encapsulation layer may be disposed to prevent the light emitting element 130 and the thin film transistor 120, which are components of the electroluminescent display device, from being oxidized or damaged due to moisture, oxygen, or impurities flowing from the outside.

The encapsulation layer may be composed of a plurality of layers, and may include a first inorganic material layer, a second inorganic material layer, and an organic material layer, but the present disclosure is not limited thereto.

Figure 7A:
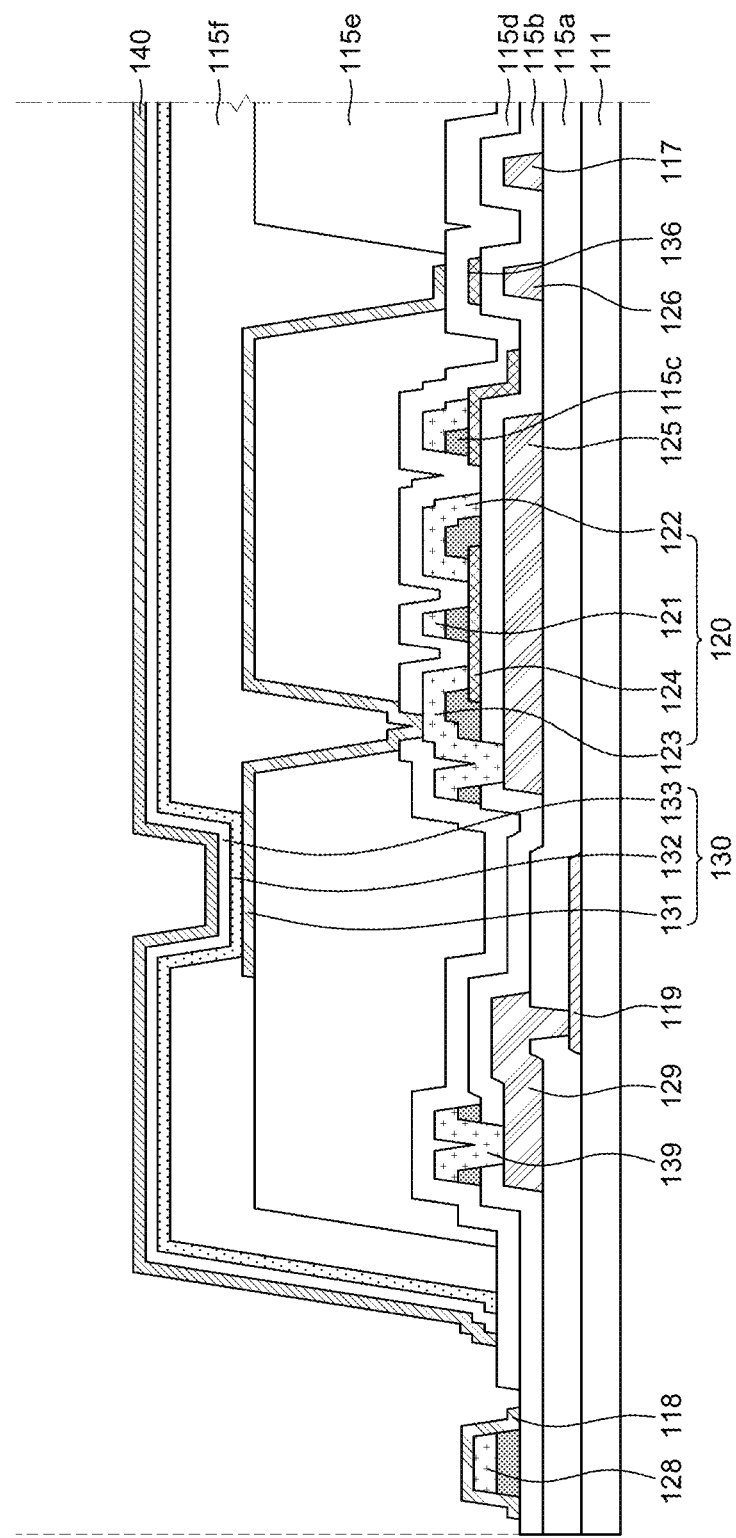
FIGS. 7A to 7C are views illustrating a part of a display panel of FIG. 4 during a manufacturing process.
Figure 7B:
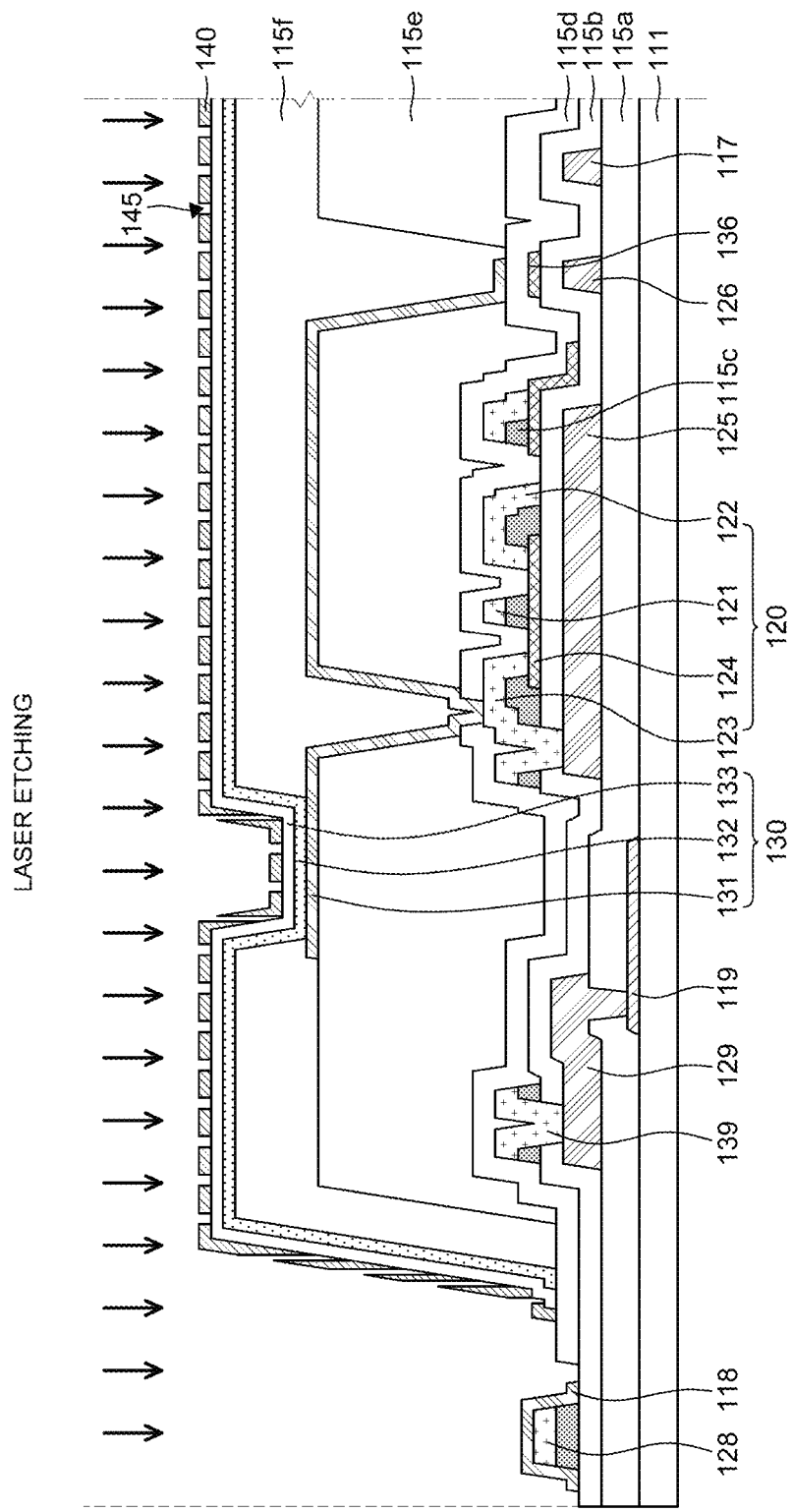
Figure 7C:
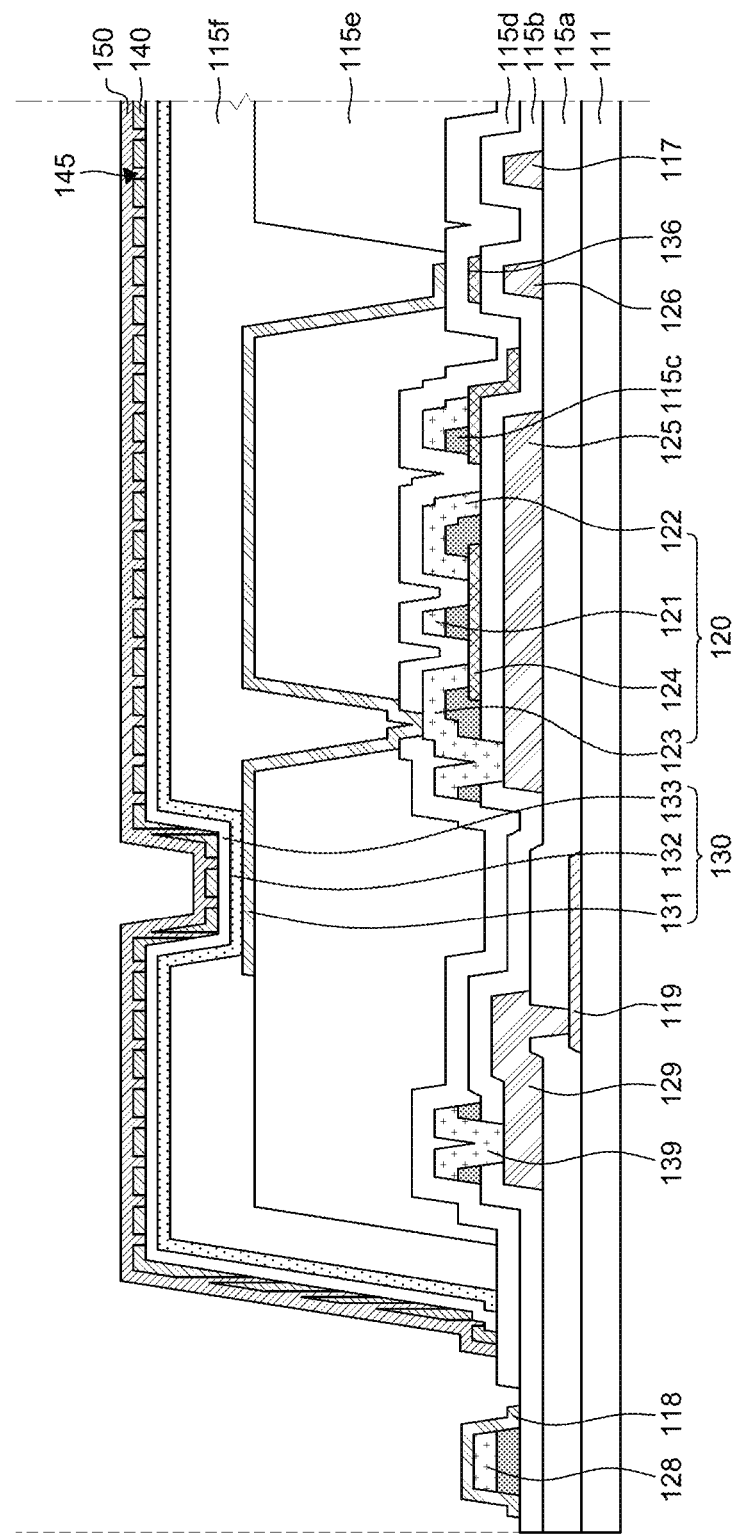

FIGS. 7A to 7C are views illustrating a part of a display panel of FIG. 4 during a manufacturing process.

FIGS. 7A to 7C illustrate only a process of forming the buffer layer 140 and the hydrogen trap layer 150 during a manufacturing process of the display panel of FIG. 4 as an example.

Referring to FIG. 7A, the buffer layer 140 of the present disclosure may be formed on the cathode 133.

The buffer layer 140 may be deposited on an entire surface of the cathode 133 to cover the cathode 133, and in order not to damage the cathode 133 and the light emitting unit 132 therebelow, the buffer layer 140 may be formed to have a thickness of at least 1 μm.

The buffer layer 140 may be formed to extend to a portion of the non-active area NA to cover the cathode 133, but the present disclosure is not limited thereto. The buffer layer 140 may be inclined along the inclined side surface of the cathode 133, but the present disclosure is not limited thereto.

The buffer layer 140 may be formed of an insulating material that does not allow hydrogen to pass therethrough and has excellent adhesion with aluminum of the hydrogen trap layer 150 and the cathode 133, and may be formed of, for example, aluminum oxide.

Thereafter, referring to FIG. 7B, the plurality of holes 145 may be formed in the surface of the buffer layer 140 by irradiating a laser onto the buffer layer 140.

That is, since the light emitting unit 132 is easily damaged by external heat or chemical substances, the plurality of holes 145 may be formed in the surface of the buffer layer 140 using a laser.

The plurality of holes 145 may be formed to be perpendicular to a laser direction, and may be formed in a checkerboard shape when viewed from above. In this case, for example, a distance between the holes 145 may be 0.5 μm or less in width and length equally, and a vertical distance thereof may be 0.5 μm or less. It should be understood that "checkerboard shape" includes arrays including rows of holes 145. The rows may extend in a first direction, and may be arranged in a second direction perpendicular to the first direction. In some embodiments, the holes 145 of adjacent rows are aligned along the second direction. In some embodiments, the holes 145 of adjacent rows are not aligned along the second direction, but are, for example, offset or staggered from each other. Other arrangements may also be included in some embodiments. For example, the rows of holes 145 may have a wavy or S-shaped arrangement along the first direction, or may have a sawtooth arrangement along the first direction. In some embodiments, the holes 145 are arranged aperiodically or stochastically, that is, having non-uniform distances separating respective neighboring pairs of the holes 145. The non-uniform distances may be greater than a selected distance to avoid merger of neighboring holes 145 that would degrade performance. It should be appreciated that, to achieve the technical benefit of increasing hydrogen trap sites in the hydrogen trap layer 150, many ranges in number of the holes 145 will accord the technical benefit, and many types of arrangement of the holes 145 will accord the technical benefit.

When the plurality of holes 145 are formed in the surface of the buffer layer 140 through laser etching, each of the plurality of holes 145 may have a circular shape when viewed from above, but the present disclosure is not limited thereto. For example, each of the plurality of holes 145 may have oval shape, and shapes of the plurality of holes 145 may differ from each other slightly.

In the case of the first example embodiment of the present disclosure, the plurality of holes 145 may be formed in an entire surface of the buffer layer 140, but the present disclosure is not limited thereto.

Thereafter, referring to FIG. 7C, the hydrogen trap layer 150 may be formed on the buffer layer 140 in which the plurality of holes 145 are formed.

The hydrogen trap layer 150 may be deposited on the entire surface of the buffer layer 140 to cover the buffer layer 140 therebelow, and may be set to have a thickness that is greater than or equal to a vertical length of the holes 145, that is, 0.5 µm or greater.

The hydrogen trap layer 150 may be disposed to extend to a portion of the non-active area NA to cover the buffer layer 140, but the present disclosure is not limited thereto.

The hydrogen trap layer 150 may be inclined along the inclined side surface of the buffer layer 140, but the present disclosure is not limited thereto.

The grooves 155 having a "V"-shape may be formed in the surface of the hydrogen trap layer 150 corresponding to the holes 145 therebelow when viewed in cross-section, but the present disclosure is not limited thereto. It should be understood that "V"-shape includes the meaning of having a shape that transitions from wider at the top to narrower at an end. For example, in FIG. 5A, the grooves 155 are wider distal from the buffer layer 140 and narrower proximal to the buffer layer 140 along the vertical axis. Sidewalls of the grooves 155 may be straight as shown, may be curved, or may be some combination thereof, while still being "V"-shaped.

Meanwhile, in the present disclosure, a plurality of holes may be formed in the entire surface of the buffer layer other than an emission area, which will be described in detail with reference to FIGS. 8 and 9.

Figure 8:
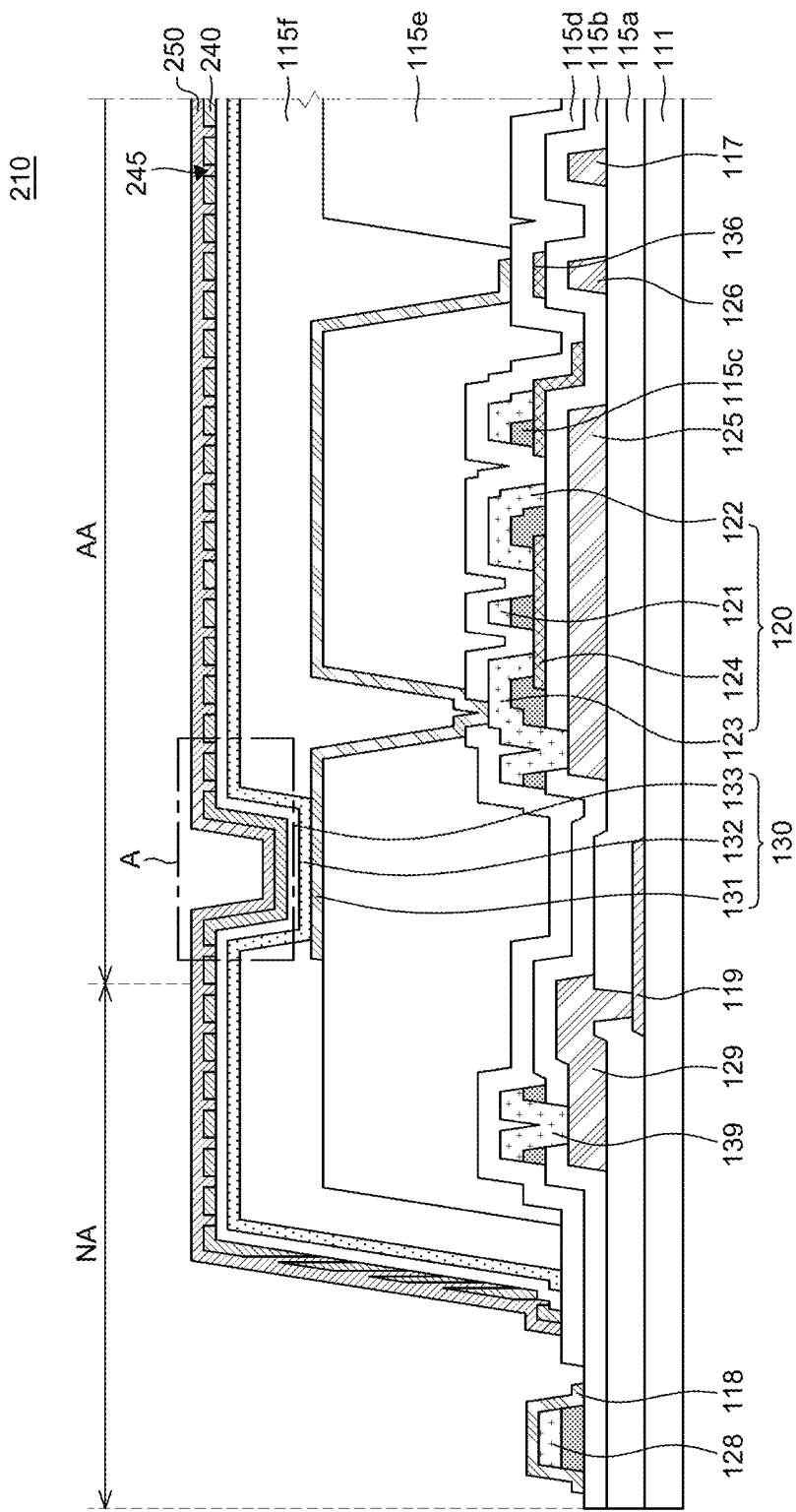
FIG. 8 is a cross-sectional view of an electroluminescent display device according to a second example embodiment of the present disclosure.

FIG. 8 is a cross-sectional view of an electroluminescent display device according to a second example embodiment of the present disclosure.

Figure 9:
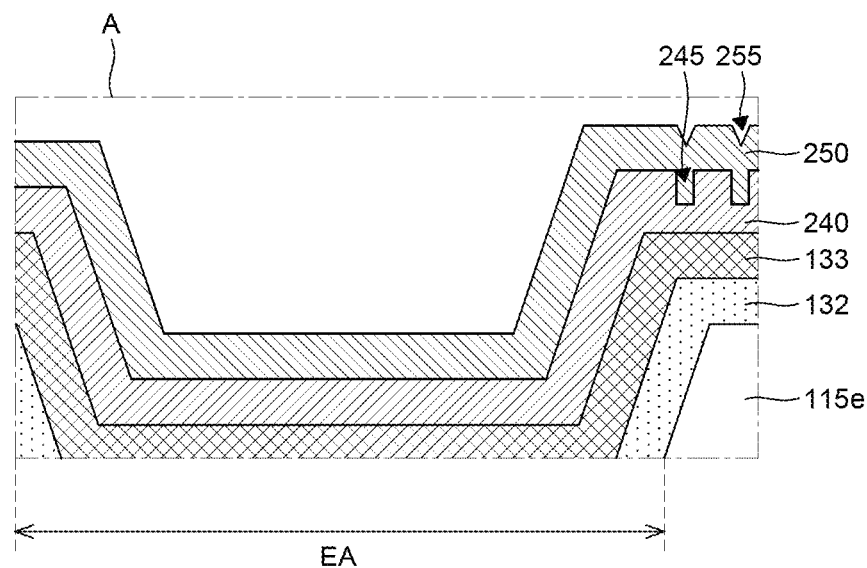
FIG. 9 is an enlarged view of part A of FIG. 8.

FIG. 9 is an enlarged view of part A of FIG. 8.

The second example embodiment of FIGS. 8 and 9 differs from the first example embodiment of FIG. 3 to FIGS. 5A and 5B described above, in terms of positions at which a plurality of holes 245 are formed in a buffer layer 240, and other configurations thereof are substantially the same, and thus, a duplicate description will be omitted. The same reference numerals are used for the same components.

FIG. 8 illustrates a case in which a touch unit is included in a display panel 210, but the present disclosure is not limited thereto.

FIG. 9 is an enlarged cross-sectional view of part A of FIG. 8.

Referring to FIGS. 8 and 9, the light emitting element 130 including the anode 131, the light emitting unit 132, and the cathode 133 may be disposed on the planarization layer 115e.

The anode 131 may be formed of indium tin oxide (ITO), indium zinc oxide (IZO), or the like, which is a transparent conductive material, but the present disclosure is not limited thereto.

For example, the second example embodiment of the present disclosure may be the bottom emission type that emits light to a lower portion where the anode 131 is disposed, but the present disclosure is not limited thereto.

The bank 115f may be disposed on the anode 131 and the planarization layer 115e.

The bank 115f that is disposed on the anode 131 and the planarization layer 115e may have openings in which respective sub-pixels are positioned, the openings belonging to an area in which light emission occurs, that is, an emission area EA.

The bank 115f may be disposed to extend to a portion of the non-active area NA, and may be inclined along an inclined side surface of the planarization layer 115e, but the present disclosure is not limited thereto.

Meanwhile, a portion of the bank 115f adjacent to the inclined side surface of the planarization layer 115e may be removed to thereby expose the passivation layer 115d.

The light emitting unit 132 may be disposed between the anode 131 and the cathode 133.

The light emitting unit 132 may be disposed to extend to a portion of the non-active area NA and may be inclined along the inclined side surface of the bank 115f, but the present disclosure is not limited thereto.

The light emitting unit 132 may be inclined along the inclined side surface of the bank 115f, but the present disclosure is not limited thereto.

The cathode 133 is disposed on the light emitting unit 132 and serves to supply electrons to the light emitting unit 132. Since the cathode 133 needs to supply electrons, it may be formed of a metallic material such as magnesium, a silver-magnesium alloy, which is a conductive material having a low work function, but the present disclosure is not limited thereto.

In the case of the bottom emission type, a metallic material constituting the cathode 133 may include a material having excellent reflectivity, but the present disclosure is not limited thereto.

The cathode 133 may be disposed to extend to a portion of the non-active area NA to cover the light emitting unit 132, but the present disclosure is not limited thereto.

The cathode 133 may be inclined along the inclined side surface of the light emitting unit 132, but the present disclosure is not limited thereto.

The buffer layer 240 according to the second example embodiment of the present disclosure may be disposed on the cathode 133.

A plurality of holes 245 may be formed in a surface of the buffer layer 240 in an area of the buffer layer 240 other than the emission area EA. It should be understood that the "area . . . other than the emission area EA" is not limited to only excluding the emission area EA. As shown in FIG. 9, the emission area EA may extend between sidewalls of the bank 115f. In some embodiments, due to process variation for example, the area other than the emission area EA may overlap slightly with the emission area EA when the position of one or more of the holes 145 of the buffer layer 140 extends slightly past the sidewalls of the bank 115f. In some embodiments, the area other than the emission area EA may not include an area slightly larger than the emission area EA, for example, when the position of the one or more of the holes 145 of the buffer layer 440 does not extend all the way up to the sidewalls of the bank 115f.

When forming the holes 245 using a laser in the buffer layer 240, laser etching is performed on a remaining surface excluding the emission area EA rather than on an entire surface of the buffer layer 240 in order to prevent non-emission due to damage to the light emitting unit 132 that is vulnerable to external impacts. In this case, it is possible to prevent non-emission to thereby improve yields and display quality.

When the plurality of holes 245 are formed in the surface of the buffer layer 240 through laser etching, they may have a circular shape when viewed from above, but the present disclosure is not limited thereto.

In order not to damage the cathode 133 and the light emitting unit 132, the buffer layer 240 may be formed to have a thickness of at least 1 µm.

The buffer layer 240 may be formed of an insulating material that does not allow hydrogen to pass therethrough and has excellent adhesion with aluminum of the hydrogen trap layer 150 and the cathode 133, and may be formed of, for example, aluminum oxide. Accordingly, the buffer layer 240 may block hydrogen trapped in the hydrogen trap layer 150 disposed thereover from flowing into the oxide thin film transistor 120 disposed therebelow.

The buffer layer 240 may be disposed to extend to a portion of the non-active area NA to cover the cathode 133, but the present disclosure is not limited thereto. The buffer layer 240 may be inclined along the inclined side surface of the cathode 133, but the present disclosure is not limited thereto.

A hydrogen trap layer 250 may be disposed on the buffer layer 240 in which the plurality of holes 245 are formed.

The hydrogen trap layer 250 may be formed of an aluminum layer having dislocations and point defects to enhance hydrogen trapping characteristics between the cathode 133 and the encapsulation layer.

The hydrogen trap layer 250 may be disposed to extend to a portion of the non-active area NA to cover the buffer layer 240, but the present disclosure is not limited thereto.

The hydrogen trap layer 250 may be inclined along an inclined side surface of the buffer layer 240, but the present disclosure is not limited thereto.

Grooves 255 having a "V"-shape may be formed in a surface of the hydrogen trap layer 250 corresponding to the holes 245 therebelow when viewed in cross-section, but the present disclosure is not limited thereto.

Meanwhile, in the present disclosure, the buffer layer can be formed only in an area excluding the emission area, which will be described in detail with reference to FIGS. 10 to 12.

Figure 10:
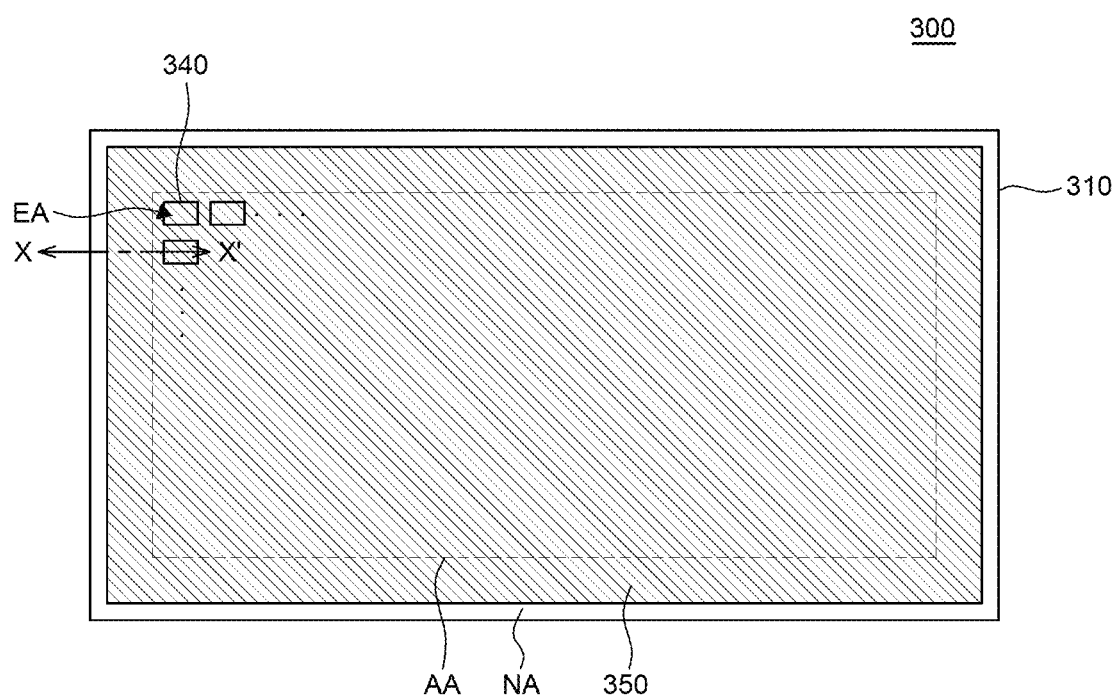
FIG. 10 is a plan view of an electroluminescent display device according to a third example embodiment of the present disclosure.

FIG. 10 is a plan view of an electroluminescent display device according to a third example embodiment of the present disclosure.

Figure 11:
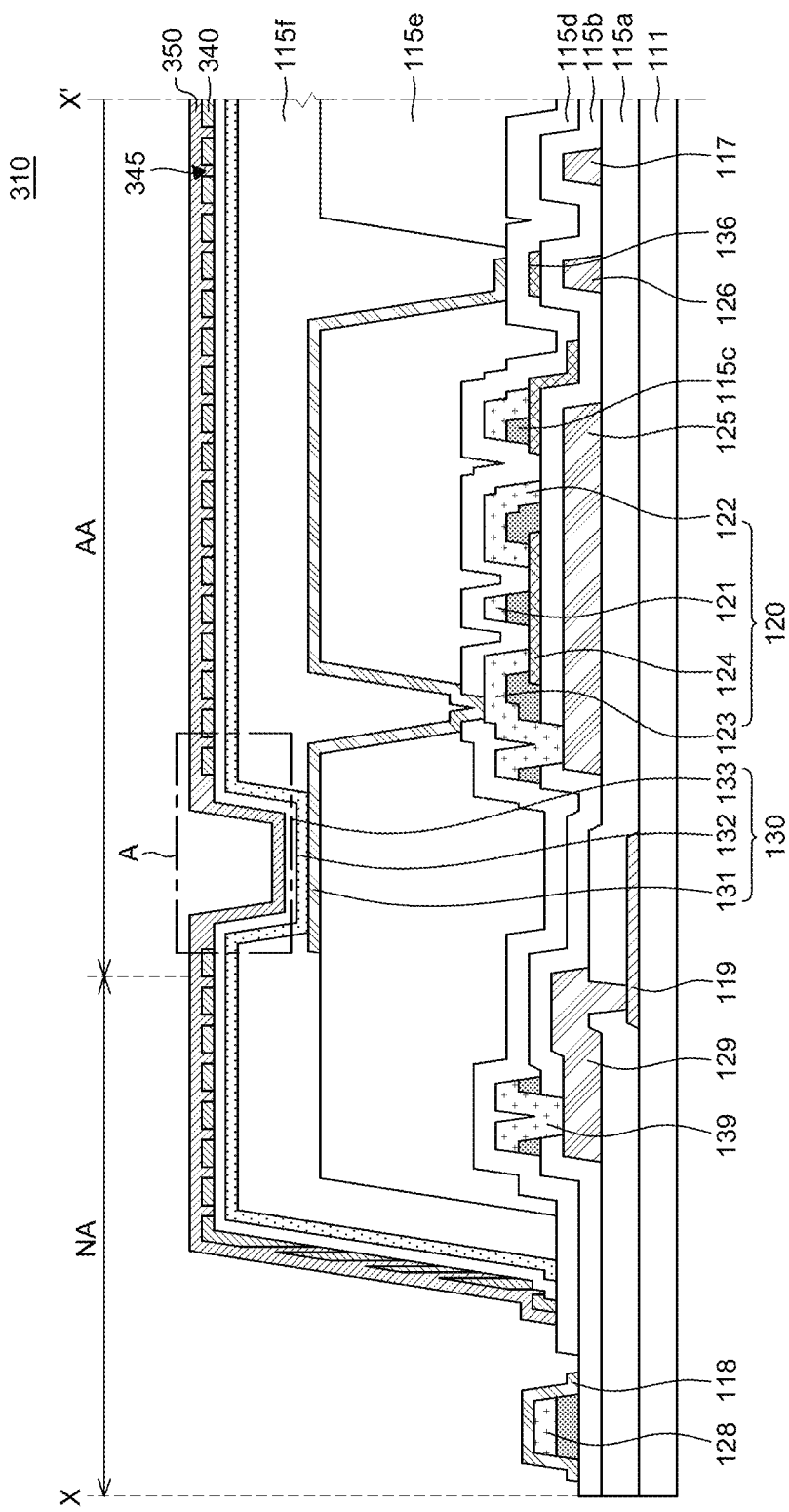
FIG. 11 is a cross-sectional view taken along line X-X' of FIG. 10.

FIG. 11 is a cross-sectional view taken along line X-X' of FIG. 10.

Figure 12:
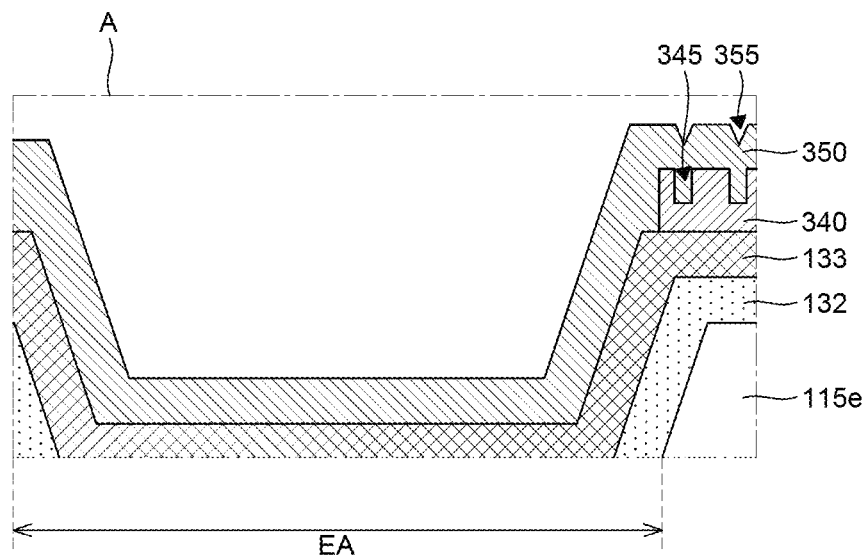
FIG. 12 is an enlarged view of part A of FIG. 11.

FIG. 12 is an enlarged view of part A of FIG. 11.

The third example embodiment of FIGS. 10 to 12 differs from the second example embodiment of FIGS. 8 and 9 described above, in terms of a position at which a buffer layer 340 is formed, and other configurations thereof are substantially the same, and thus, a duplicate description will be omitted. The same reference numerals are used for the same components FIG. 11 illustrates a case in which a touch unit is included in a display panel 310, but the present disclosure is not limited thereto.

FIG. 12 is an enlarged cross-sectional view of part A of FIG. 11.

Referring to FIGS. 10 to 12, in an electroluminescence display 300 according to the third example embodiment of the present disclosure, the buffer layer 340 according to the third example embodiment of the present disclosure may be disposed on the cathode 133.

The buffer layer 340 may be formed only in an area excluding the emission area EA. In addition, a plurality of holes 345 may be formed in a surface of the buffer layer 340 that is formed only in the area excluding the emission area EA. It should be understood that the "area excluding the emission area EA" is not limited to only excluding the emission area EA. As shown in FIG. 12, the emission area EA may extend between sidewalls of the bank 115f. In some embodiments, due to process variation for example, the area "excluding" the emission area EA may overlap slightly with the emission area EA when sidewalls of the buffer layer 340 extend slightly past the sidewalls of the bank 115f. In some embodiments, the area excluding the emission area EA may not include an area slightly larger than the emission area EA, for example, when the sidewalls of the buffer layer 340 do not extend all the way up to the sidewalls of the bank 115f.

In order to prevent non-emission due to damage to the light emitting unit 132 that is vulnerable to external impacts, the buffer layer 340 may be formed only in the area excluding the emission area EA, and then, laser etching may be performed. In this case, it is possible to prevent non-emission to thereby improve yields and display quality.

In particular, when the buffer layer 340 is formed only in the area excluding the emission area EA, a possibility that light passing through without being reflected by the cathode 133 is absorbed by the buffer layer 340 of the emission area EA, thereby reducing light efficiency, can be eliminated.

When the plurality of holes 345 are formed in the surface of the buffer layer 340 through laser etching, they may have a circular shape when viewed from above, but the present disclosure is not limited thereto.

In order not to damage the cathode 133 and the light emitting unit 132, the buffer layer 340 may be formed to have a thickness of at least 1 μm.

The buffer layer 340 may be formed of, for example, aluminum oxide.

The buffer layer 340 may be disposed to extend to a portion of the non-active area NA to cover the cathode 133, but the present disclosure is not limited thereto. The buffer layer 340 may be inclined along the inclined side surface of the cathode 133, but the present disclosure is not limited thereto.

A hydrogen trap layer 350 may be disposed on the buffer layer 340 in which the plurality of holes 345 are formed.

The hydrogen trap layer 350 may be formed of an aluminum layer.

The hydrogen trap layer 350 may be disposed to extend to a portion of the non-active area NA to cover the buffer layer 340, but the present disclosure is not limited thereto.

The hydrogen trap layer 350 may be inclined along an inclined side surface of the buffer layer 340, but the present disclosure is not limited thereto.

Grooves 355 having a "V"-shape may be formed in a surface of the hydrogen trap layer 350 corresponding to the holes 345 therebelow when viewed in cross-section, but the present disclosure is not limited thereto.

In particular, the third example embodiment of the present disclosure is characterized in that, the hydrogen trap layer 350 is entirely deposited on the buffer layer 340 deposited on the cathode 133 other than the emission area EA, so that the hydrogen trap layer 350 having many trap sites is formed by the buffer layer 340 in which the plurality of holes 345 are formed in a non-emission area, while in the emission area EA, a high quality of the hydrogen trap layer 350 having reflective properties is deposited on the cathode 133, so that light efficiency of the emission area EA can be improved.

In addition, the third example embodiment of the present disclosure is characterized in that the grooves 355 having a "V"-shape may be formed in the surface of the hydrogen trap layer 350 corresponding to the holes 345 therebelow, other than the emission area EA.

Meanwhile, the present disclosure is not limited to the bottom emission type, and can be applied to a top emission type in which light is emitted to an upper portion where the cathode is disposed, which will be described in detail with reference to FIGS. 13 to 15.

Figure 13:
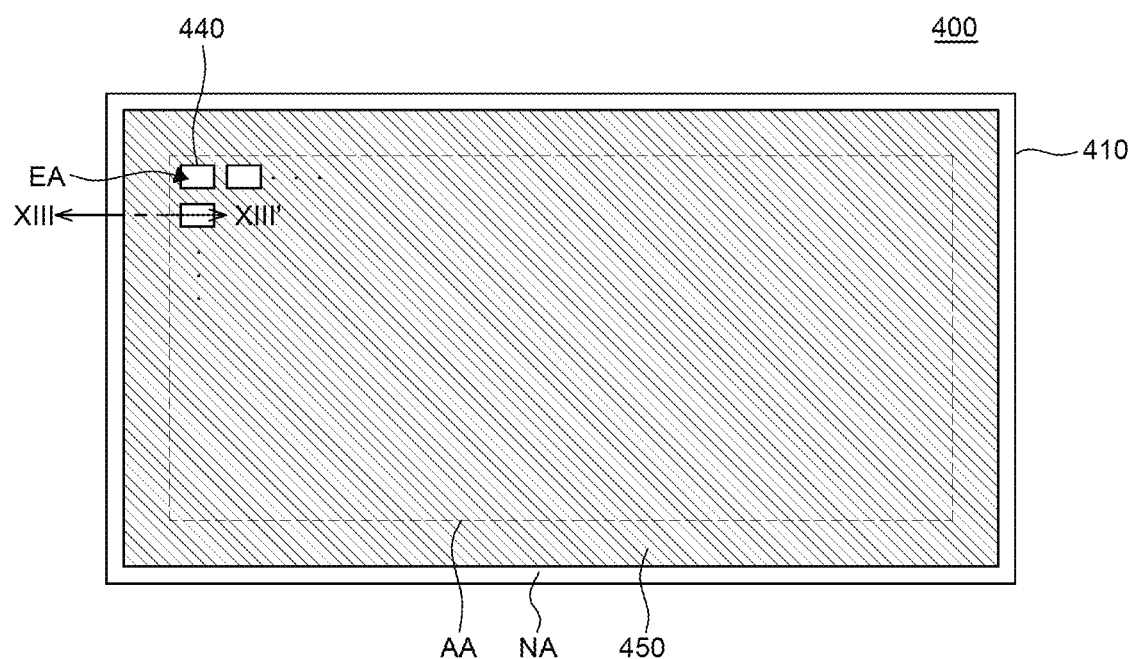
FIG. 13 is a plan view of an electroluminescent display device according to a fourth example embodiment of the present disclosure.

FIG. 13 is a plan view of an electroluminescent display device according to a fourth example embodiment of the present disclosure.

Figure 14:
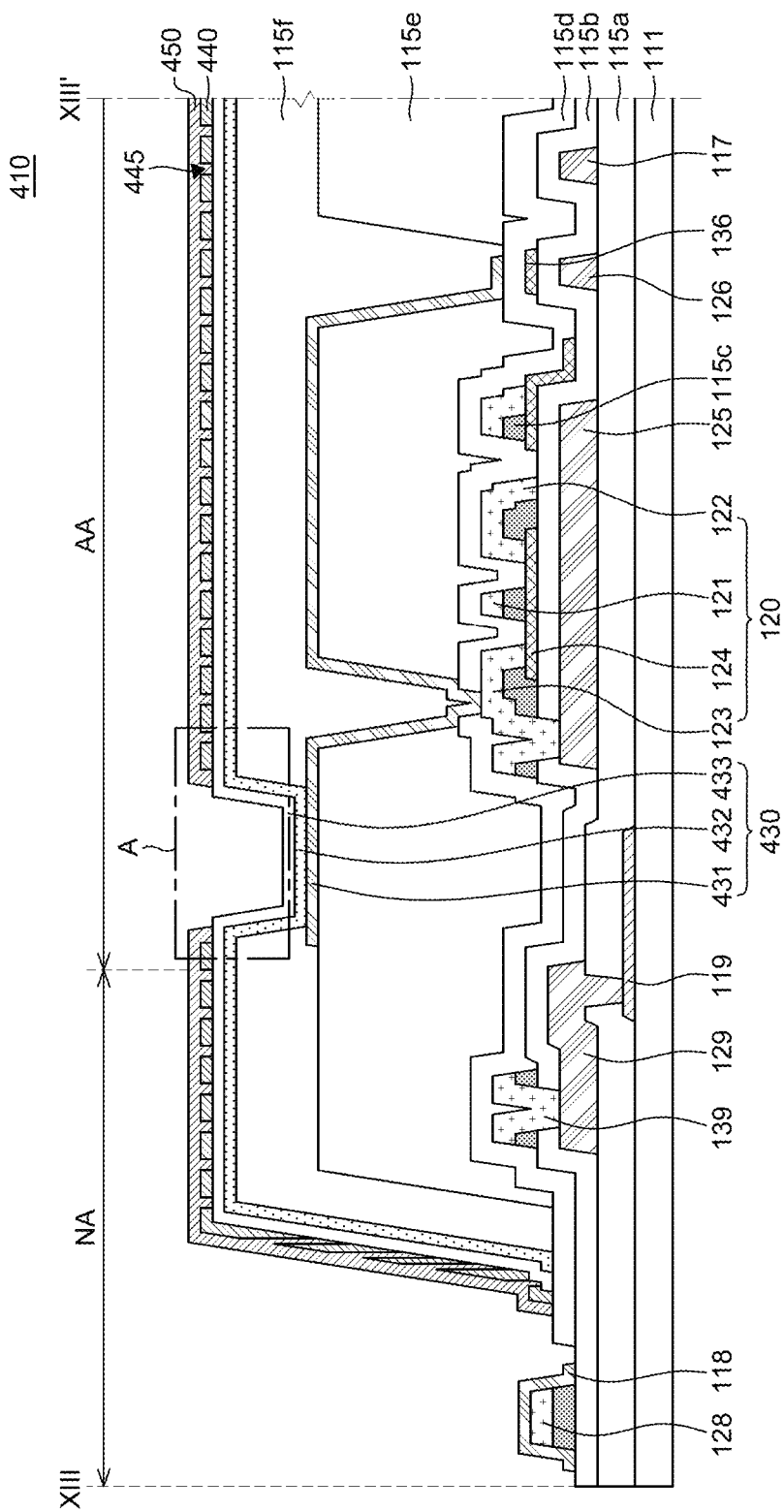
FIG. 14 is a cross-sectional view taken along line XIII-XIII' of FIG. 13

FIG. 14 is a cross-sectional view taken along line XIII-XIII' of FIG. 13.

Figure 15:
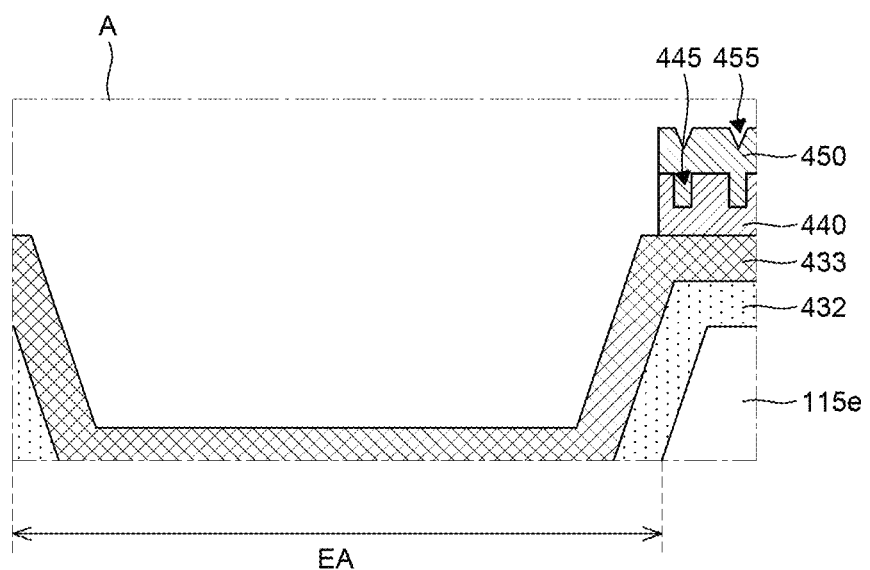
FIG. 15 is an enlarged view of part A of FIG. 14.

FIG. 15 is an enlarged view of part A of FIG. 14.

The fourth example embodiment of FIGS. 13 to 15 differs from the first example embodiment of FIG. 3 to FIGS. 5A and 5B described above, in that the top emission type is applied and thus, positions at which a buffer layer 440 and a hydrogen trap layer 450 are formed are varied, and other configurations thereof are substantially the same, and thus, a duplicate description will be omitted. The same reference numerals are used for the same components.

FIG. 14 illustrates a case in which a touch unit or circuit is included in a display panel 410, but the present disclosure is not limited thereto.

FIG. 15 is an enlarged cross-sectional view of part A of FIG. 14.

Referring to FIGS. 13 to 15, in an electroluminescence display device 400 according to the fourth example embodiment of the present disclosure, a light emitting element 430 including an anode 431, a light emitting unit or structure 432, and a cathode 433 may be disposed on the planarization layer 115e.

The anode 431 may be disposed on the planarization layer 115e.

For example, in the case of the top emission type in which light is emitted to an upper portion where the cathode 433 is disposed as in the fourth example embodiment of the present disclosure, it may further include a reflective layer such that the emitted light is reflected from the anode 431 and is smoothly emitted in a direction toward the upper portion where the cathode 433 is disposed.

That is, the anode 431 may be a two-layer structure in which a transparent conductive layer formed of a transparent conductive material and a reflective layer are sequentially stacked, or a three-layer structure in which a transparent conductive layer, a reflective layer and a transparent conductive layer are sequentially stacked. The reflective layer may be formed of silver (Ag) or an alloy including silver.

The bank 115f may be disposed on the anode 431 and the planarization layer 115e.

The light emitting unit 432 may be disposed between the anode 431 and the cathode 433.

The cathode 433 is disposed on the light emitting unit 432, and in the case of the top emission type, the cathode 433 may be a transparent conductive oxide, such as indium tin oxide (ITO), indium zinc oxide (IZO), indium tin zinc oxide (ITZO), zinc oxide (ZnO) and tin oxide (TO).

The buffer layer 440 according to the fourth example embodiment of the present disclosure may be disposed on the cathode 433.

The buffer layer 440 may be formed only in an area excluding the emission area EA. In addition, a plurality of holes 445 may be formed in a surface of the buffer layer 440 formed only in the area excluding the emission area EA. It should be understood that the "area excluding the emission area EA" is not limited to only excluding the emission area EA. As shown in FIG. 15, the emission area EA may extend between sidewalls of the bank 115f. In some embodiments, due to process variation for example, the area "excluding" the emission area EA may overlap slightly with the emission area EA when sidewalls of the buffer layer 440 and/or sidewalls of the hydrogen trap layer 450 extend slightly past the sidewalls of the bank 115f. In some embodiments, the area excluding the emission area EA may not include an area slightly larger than the emission area EA, for example, when the sidewalls of the buffer layer 440 and/or sidewalls of the hydrogen trap layer 450 do not extend all the way up to the sidewalls of the bank 115f.

In order to prevent non-emission due to damage to the light emitting unit 432 that is vulnerable to external impacts, the buffer layer 440 may be formed only in the area excluding the emission area EA and laser etching may be performed. In this case, it is possible to prevent non-emission to thereby improve yields and display quality.

In particular, when the buffer layer 440 is formed only in the area excluding the emission area EA, a possibility that light passing through without being reflected by the cathode 433 is absorbed by the buffer layer 440 of the emission area EA, thereby reducing light efficiency, can be eliminated.

When the plurality of holes 445 are formed in the surface of the buffer layer 440 through laser etching, they may have a circular shape when viewed from above, but the present disclosure is not limited thereto.

In order not to damage the cathode 433 and the light emitting unit 432, the buffer layer 440 may be formed to have a thickness of at least 1 μm.

The buffer layer 440 may be formed of, for example, aluminum oxide.

The buffer layer 440 may be disposed to extend to a portion of the non-active area NA to cover the cathode 433, but the present disclosure is not limited thereto. The buffer layer 3440 may be inclined along an inclined side surface of the cathode 433, but the present disclosure is not limited thereto.

The hydrogen trap layer 450 may be disposed on the buffer layer 440 in which the plurality of holes 445 are formed.

The hydrogen trap layer 450 may be formed of an aluminum layer.

The fourth example embodiment of the present disclosure is characterized in that the hydrogen trap layer 450 is formed only in the area excluding the emission area EA. That is, the hydrogen trap layer 450 may be formed only on the buffer layer 440 other than the emission area EA.

Since the hydrogen trap layer 450 is formed of an aluminum layer and thus, is opaque, it is preferable to apply a bottom emission type when the hydrogen trap layer 450 is deposited on an entire surface of the display panel 410. In the case of applying the top emission type in which light generated from an organic layer, which is the light emitting unit 432, is emitted upwardly as in the fourth example embodiment of the present disclosure, it is preferable to form the hydrogen trap layer 450 that is opaque only in the area other than the emission area EA.

The hydrogen trap layer 450 may be disposed to extend to a portion of the non-active area NA to cover the buffer layer 440, but the present disclosure is not limited thereto.

The hydrogen trap layer 450 may be inclined along an inclined side surface of the buffer layer 440, but the present disclosure is not limited thereto.

Grooves 455 having a "V"-shape may be formed in a surface of the hydrogen trap layer 450 corresponding to the holes 445 therebelow when viewed in cross-section, but the present disclosure is not limited thereto.

The example embodiments of the present disclosure can also be described as follows:

According to an aspect of the present disclosure, there is provided an electroluminescent display device. The electroluminescent display device includes a substrate including an active area having an emission area and a non-active area, a planarization layer disposed on the substrate, a light emitting element disposed on the planarization layer, a buffer layer disposed on the light emitting element and having a plurality of holes in a surface thereof and a hydrogen trap layer disposed on the buffer layer.

The light emitting element may include an anode; a light emitting unit disposed on the anode; and a cathode disposed on the light emitting unit.

The electroluminescent display device may further include a thin film transistor disposed on the substrate and electrically connected to the anode, wherein the thin film transistor includes a semiconductor layer made of an oxide semiconductor.

The plurality of holes may have a checkerboard shape on a plane, and each of the holes may have a circular shape.

The buffer layer may be made of aluminum oxide, and the hydrogen trap layer may be made of aluminum.

The buffer layer may be disposed to extend to a portion of the non-active area to cover the cathode.

The buffer layer may have an inclination along an inclined side surface of the cathode.

The plurality of holes may be disposed in a surface of the buffer layer other than the emission area.

The buffer layer may be disposed in the area other than the emission area.

The hydrogen trap layer may be disposed in the area other than the emission area.

The electroluminescence display device may be configured in a top emission type.

The hydrogen trap layer may have a hydrogen trap site of a dislocation or a point defect in a direction perpendicular to the hole.

The hydrogen trap layer may be disposed to extend to the portion of the non-active area to cover the buffer layer.

The hydrogen trap layer may have an inclination along an inclined side surface of the buffer layer.

The hydrogen trap layer may have grooves having a "V"-shape in cross-section in a surface thereof corresponding to the holes.

According to another aspect of the present disclosure, there is provided an electroluminescent display device. The electroluminescent display device includes a planarization layer disposed on a substrate, a light emitting element disposed on the planarization layer, a buffer layer disposed on the light emitting element and having a plurality of holes in a surface thereof and a hydrogen trap layer disposed on the buffer layer and having grooves on a surface thereof corresponding to the holes.

The buffer layer may be made of aluminum oxide, and the hydrogen trap layer may be made of aluminum.

The plurality of holes may be disposed in a surface of the buffer layer other than an emission area.

The buffer layer may be disposed in an area excluding the emission area.

The hydrogen trap layer may be disposed in the area excluding the emission area.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
a substrate including an active area and a non-active area, the active area having an emission area;
a planarization layer disposed on the substrate;
a light emitting element disposed on the planarization layer;
a buffer layer disposed on the light emitting element and having a plurality of holes in a surface thereof; and
a hydrogen trap layer disposed on the buffer layer.

2. The electroluminescent display device of claim 1, wherein the light emitting element includes,
an anode;
a light emitting structure disposed on the anode; and
a cathode disposed on the light emitting structure.

3. The electroluminescent display device of claim 2, further comprising:
a thin film transistor disposed on the substrate and electrically connected to the anode,
wherein the thin film transistor includes a semiconductor layer including an oxide semiconductor.

4. The electroluminescent display device of claim 2, wherein the buffer layer is disposed to extend to a portion of the non-active area to cover the cathode.

5. The electroluminescent display device of claim 4, wherein the buffer layer has an inclination along an inclined side surface of the cathode.

6. The electroluminescent display device of claim 5, wherein the hydrogen trap layer is disposed to extend to the portion of the non-active area to cover the buffer layer.

7. The electroluminescent display device of claim 6, wherein the hydrogen trap layer has an inclination along an inclined side surface of the buffer layer.

8. The electroluminescent display device of claim 1, wherein the plurality of holes have a checkerboard shape on a plane, and each of the holes has a circular shape.

9. The electroluminescent display device of claim 1, wherein the buffer layer includes aluminum oxide, and the hydrogen trap layer is aluminum.

10. The electroluminescent display device of claim 1, wherein the plurality of holes are disposed in a surface of the buffer layer in an area other than the emission area.

11. The electroluminescent display device of claim 10, wherein the buffer layer is disposed in the area other than the emission area.

12. The electroluminescent display device of claim 11, wherein the hydrogen trap layer is disposed in the area other than the emission area.

13. The electroluminescent display device of claim 12, wherein the electroluminescence display device is configured in a top emission type.

14. The electroluminescent display device of claim 1, wherein the hydrogen trap layer has a hydrogen trap site that is a dislocation or a point defect in a direction perpendicular to the hole.

15. The electroluminescent display device of claim 1, wherein the hydrogen trap layer has grooves having a "V"-shape in cross-section in a surface thereof corresponding to the holes.

16. An electroluminescent display device, comprising:
a planarization layer disposed on a substrate;
a light emitting element disposed on the planarization layer;
a buffer layer disposed on the light emitting element and having a plurality of holes in a surface thereof; and
a hydrogen trap layer disposed on the buffer layer and having grooves on a surface thereof corresponding to the holes.

17. The electroluminescent display device of claim 16, wherein the buffer layer includes aluminum oxide, and the hydrogen trap layer is aluminum.

18. The electroluminescent display device of claim 16, wherein the plurality of holes are disposed in a surface of the buffer layer other than an emission area.

19. The electroluminescent display device of claim 18, wherein the buffer layer is disposed in an area excluding the emission area.

20. The electroluminescent display device of claim 19, wherein the hydrogen trap layer is disposed in the area excluding the emission area.

21. A method, comprising:
forming a planarization layer on a substrate;
forming a light emitting element on the planarization layer;
forming a buffer layer on the light emitting element;
forming a plurality of holes in the buffer layer, and
forming a hydrogen trap layer on the buffer layer, the hydrogen trap layer having a plurality of grooves on a surface thereof, each of the plurality of grooves overlapping a respective one of the plurality of holes.

* * * * *